US010571800B2

(12) United States Patent
Brouns et al.

(10) Patent No.: US 10,571,800 B2
(45) Date of Patent: Feb. 25, 2020

(54) MASK ASSEMBLY AND ASSOCIATED METHODS

(71) Applicant: ASML Netherlands B.V., Veldhoven (NL)

(72) Inventors: Derk Servatius Gertruda Brouns, Herentals (NL); Dennis De Graaf, Waalre (NL); Robertus Cornelis Martinus De Kruif, Eindhoven (NL); Paul Janssen, Eindhoven (NL); Matthias Kruizinga, Herten (NL); Arnoud Willem Notenboom, Rosmalen (NL); Daniel Andrew Smith, Eindhoven (NL); Beatrijs Louise Marie-Joseph Katrien Verbrugge, Kasterlee (NL); James Norman Wiley, Menlo Park (NL)

(73) Assignee: ASML Netherlands B.V., Veldhoven (NL)

( * ) Notice: Subject to any disclaimer, the term of this patent is extended or adjusted under 35 U.S.C. 154(b) by 97 days.

(21) Appl. No.: 15/545,390

(22) PCT Filed: Feb. 1, 2016

(86) PCT No.: PCT/EP2016/052055
§ 371 (c)(1),
(2) Date: Jul. 21, 2017

(87) PCT Pub. No.: WO2016/124536
PCT Pub. Date: Aug. 11, 2016

(65) Prior Publication Data
US 2018/0314150 A1 Nov. 1, 2018

Related U.S. Application Data

(60) Provisional application No. 62/270,330, filed on Dec. 21, 2015, provisional application No. 62/118,922, filed on Feb. 20, 2015, provisional application No. 62/111,380, filed on Feb. 3, 2015.

(51) Int. Cl.
*G03F 1/84* (2012.01)
*G03F 1/66* (2012.01)
*G03F 1/22* (2012.01)
*G03F 1/42* (2012.01)
*G03F 1/64* (2012.01)
*G03F 1/62* (2012.01)

(52) U.S. Cl.
CPC .............. *G03F 1/84* (2013.01); *G03F 1/22* (2013.01); *G03F 1/42* (2013.01); *G03F 1/62* (2013.01); *G03F 1/64* (2013.01); *G03F 1/66* (2013.01)

(58) Field of Classification Search
CPC ..... G03F 1/22; G03F 1/42; G03F 1/64; G03F 1/66; G03F 1/84

USPC ....................................................... 430/5, 30
See application file for complete search history.

(56) References Cited

U.S. PATENT DOCUMENTS

| 5,652,657 | A | 7/1997 | Yoshii et al. |
|---|---|---|---|
| 6,101,237 | A | 8/2000 | Miyashi et al. |
| 6,239,863 | B1 | 5/2001 | Catey et al. |
| 6,264,773 | B1 | 7/2001 | Cerio |
| 6,492,067 | B1 | 12/2002 | Klebanoff et al. |
| 6,566,018 | B2 | 5/2003 | Muzio et al. |
| 6,569,582 | B2 | 5/2003 | Cullins et al. |
| 6,646,720 | B2 | 11/2003 | Ramamoorthy et al. |
| 6,734,445 | B2 | 5/2004 | Ramamoorthy et al. |
| 7,420,655 | B2 | 9/2008 | Matsutori et al. |
| 7,422,828 | B1 | 9/2008 | Kim et al. |
| 8,018,578 | B2 | 9/2011 | Banine et al. |
| 8,207,504 | B2 | 6/2012 | Braude et al. |
| 8,968,971 | B2 | 3/2015 | Wang |
| 2003/0136512 | A1 | 7/2003 | Yamamoto |
| 2004/0067424 | A1 | 4/2004 | Schilz et al. |

(Continued)

FOREIGN PATENT DOCUMENTS

| CN | 1792742 A | 6/2006 |
|---|---|---|
| JP | S61-145936 A | 7/1986 |

(Continued)

OTHER PUBLICATIONS

International Preliminary Report on Patentability and Written Opinion of the International Searching Authority directed to International Patent Application No. PCT/EP2016/052055, dated Aug. 8, 2017; 11 pages.

(Continued)

*Primary Examiner* — Christopher G Young
(74) *Attorney, Agent, or Firm* — Sterne, Kessler, Goldstein & Fox P.L.L.C.

(57) ABSTRACT

A method comprising the steps of receiving a mask assembly comprising a mask and a removable EUV transparent pellicle held by a pellicle frame, removing the pellicle frame and EUV transparent pellicle from the mask, using an inspection tool to inspect the mask pattern on the mask, and subsequently attaching to the mask an EUV transparent pellicle held by a pellicle frame. The method may also comprise the following steps: after removing the pellicle frame and EUV transparent pellicle from the mask, attaching to the mask an alternative pellicle frame holding an alternative pellicle formed from a material which is substantially transparent to an inspection beam of the inspection tool; and after using an inspection tool to inspect the mask pattern on the mask, removing the alternative pellicle held by the alternative pellicle frame from the mask in order to attach to the mask the EUV transparent pellicle held by the pellicle frame.

27 Claims, 9 Drawing Sheets

(56) References Cited

U.S. PATENT DOCUMENTS

| | | |
|---|---|---|
| 2008/0259291 A1 | 10/2008 | Banine et al. |
| 2011/0121193 A1 | 5/2011 | Braude et al. |
| 2014/0268119 A1 | 9/2014 | Chu et al. |
| 2015/0028203 A1 | 1/2015 | Litman et al. |

FOREIGN PATENT DOCUMENTS

| | | |
|---|---|---|
| JP | S63-72119 A | 4/1988 |
| JP | 5002263 A | 1/1993 |
| JP | H0934102 A | 2/1997 |
| JP | H10-70066 A | 3/1998 |
| JP | H10-144594 A | 5/1998 |
| JP | 2006-173273 A | 6/2006 |
| JP | 2008-268956 A | 11/2008 |
| JP | 2010-139593 A | 6/2010 |
| WO | WO 2016/124536 A2 | 8/2016 |

OTHER PUBLICATIONS

International Search Report directed to related International Patent Application No. PCT/EP2016/052055, dated Aug. 1, 2016; 7 pages.
Japanese Search Report by Registered Search Organization with English-language translation attached, dated Nov. 22, 2019; 50 pages.

MASK ASSEMBLY AND ASSOCIATED METHODS

CROSS-REFERENCE TO RELATED APPLICATIONS

This application claims priority of U.S. application 62/111,380 which was filed on 3 Feb. 2015 and of U.S. application 62/118,922 which was filed on 20 Feb. 2015 and of U.S. application 62/270,330 which was filed on 21 Dec. 2015, which are all incorporated herein in its entirety by reference

FIELD

The present invention relates to a mask assembly, and particularly but not exclusively to methods which use a mask assembly. A mask assembly may comprise a mask and a pellicle. The present invention has particular, but not exclusive, use in connection with EUV lithographic apparatus and EUV lithographic tools.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g., a mask) onto a layer of radiation-sensitive material (resist) provided on a substrate.

The wavelength of radiation used by a lithographic apparatus to project a pattern onto a substrate determines the minimum size of features that can be formed on that substrate. A lithographic apparatus that uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A mask that is used to impart a pattern to a radiation beam in a lithographic apparatus may form part of a mask assembly. A mask assembly may include a pellicle that protects the mask from particle contamination. The pellicle may be supported by a pellicle frame.

The use of pellicles in lithography is well-known and well-established. A typical pellicle in a DUV lithographic apparatus is a membrane which is located away from the mask and is out of the focal plane of a lithographic apparatus in use. Because the pellicle is out of the focal plane of the lithographic apparatus, contamination particles which land on the pellicle are out of focus in the lithographic apparatus. Consequently, images of the contamination particles are not projected onto the substrate. If the pellicle were not present, then a contamination particle which landed on the mask would be projected onto the substrate and would introduce a defect into the projected pattern.

It may be desirable to use a pellicle in an EUV lithographic apparatus. EUV lithography differs from DUV lithography in that it is typically performed in a vacuum and the mask is typically reflective rather than being transmissive. Challenges relating to the use of a pellicle for EUV lithography may arise which are not present when a pellicle for DUV lithography.

It may be desirable to provide a mask assembly and associated methods which overcome or mitigate a problem associated with the prior art.

SUMMARY

According to a first aspect of the invention there is provided a method comprising the steps of receiving a mask assembly comprising a mask and a removable EUV transparent pellicle held by a pellicle frame, removing the pellicle frame and EUV transparent pellicle from the mask, using an inspection tool to inspect the mask pattern on the mask, and subsequently attaching to the mask an EUV transparent pellicle held by a pellicle frame.

The method is advantageous because it allows inspection of the mask without interference from the EUV transparent pellicle (which may be opaque to a beam used by the mask inspection tool).

The method may further comprise, after removing the pellicle frame and EUV transparent pellicle from the mask, attaching to the mask an alternative pellicle frame holding an alternative pellicle formed from a material which is substantially transparent to an inspection beam of the inspection tool, and after using an inspection tool to inspect the mask pattern on the mask, removing the alternative pellicle held by the alternative pellicle frame from the mask in order to attach to the mask the EUV transparent pellicle held by the pellicle frame.

Removing the pellicle frame from the mask may comprise disengaging an attachment mechanism from an attachment feature, and attaching the pellicle frame to the mask may comprise engaging the attachment mechanism to an attachment feature. The attachment feature may be coupled to the mask and the attachment mechanism may be coupled to the pellicle frame. The attachment feature may be coupled to the mask also after removing the pellicle frame and EUV transparent pellicle from the mask by disengaging the attachment mechanism from the attachment feature, such that the attachment feature is available for subsequent attachment of an EUV transparent pellicle held by a pellicle frame after inspecting the mask pattern on the mask. The alternative pellicle may be attached to the mask such that the attachment feature of the EUV transparent pellicle does not touch the alternative pellicle.

The attachment mechanism may comprise a locking member configured to engage with an attachment feature comprising a protrusion.

The EUV transparent pellicle and pellicle frame which is subsequently attached to the mask may be the same EUV transparent pellicle and pellicle frame that was removed from the mask.

The alternative pellicle may be substantially transparent to a non-EUV radiation beam used by the mask inspection tool.

The non-EUV radiation beam used by the mask inspection tool may be a DUV radiation beam.

The alternative pellicle may be substantially transparent to a particle beam used by the mask inspection tool.

The particle beam used by the mask inspection tool may be an electron beam.

The alternative pellicle may be attached to the mask using an attachment mechanism which is used solely for the alternative pellicle and is not used for the attachment of the EUV transparent pellicle.

The mask may be in a clean environment throughout the method.

The method may further comprise transferring the mask assembly inside a sealed container from a lithographic apparatus to a pellicle removal and attachment tool.

The method may further comprise transferring one or more selected from the mask, the pellicle assembly or the mask assembly inside a sealed container from a pellicle removal and attachment tool to a mask inspection tool.

The mask inspection tool may be integrated with the pellicle removal and attachment tool such that the mask assembly stays in the same environment.

The method may further comprise cleaning the mask or the pellicle.

The sealed container may have a recessed portion configured to accommodate sagging of the pellicle.

A separation between the recessed portion of the container and a plane of the pellicle of the mask assembly may be between is between 0.5 mm and 1 mm.

According to a second aspect of the invention there is provided a method comprising the steps of receiving a mask assembly comprising a mask and an EUV transparent pellicle held by a pellicle frame arranged to be removably attachable to the mask, removing the pellicle frame and EUV transparent pellicle from the mask, attaching to the mask an alternative pellicle held by an alternative pellicle frame arranged to be removably attachable to the mask, wherein the alternative pellicle is formed from a material different to the material used to form the EUV transparent pellicle, which material is substantially transparent to an inspection beam of an inspection tool, using the inspection beam in the inspection tool to inspect the mask pattern on the mask, removing the alternative pellicle from the mask, and subsequently attaching to the mask an EUV transparent pellicle held by a pellicle frame.

The method is advantageous because it allows inspection of the mask without interference from the EUV transparent pellicle (which may be opaque to a beam used by the mask inspection tool).

The alternative pellicle frame may be attached to the mask at a different location than the EUV transparent pellicle frame.

According to a third aspect of the invention there is provided a mask assembly container comprising an opening through which a mask assembly may be placed inside the container, and a seal which seals shut the opening when the mask assembly is located inside the container, wherein the container has a floor configured to accommodate outward sagging of the pellicle.

Accommodating sagging of the pellicle in this manner is advantageous because it avoids the pellicle touching the container, which would be liable to damage the pellicle.

The floor may be between 0.5 mm and 1 mm or more away from a pellicle plane when the mask assembly is held in the sealed container.

According to a fourth aspect of the invention there is provided a mask provided with a protrusion configured to receive a pellicle frame attachment mechanism, wherein a bottom surface of the protrusion has a lip which defines a recess in the surface of the base, and wherein the protrusion is attached to the mask by glue in the recess.

Attaching the protrusion in this manner is advantageous because it reduces the risk of unwanted outgassing from the glue.

The volume of the glue may be less than the volume of the recess.

The glue may pull the protrusion towards the mask such that the recess and the mask form a substantially enclosed space which retains the glue.

The protrusion may comprise an opening in the lip such that the recess and the mask form a space which is partially open for glue outgassing The protrusion may be attached to substrate material of the mask.

According to a fifth aspect of the invention there is provided a pellicle assembly container comprising an opening through which a pellicle assembly may be placed inside the container, and a seal which seals shut the opening when the pellicle assembly is located inside the container, wherein the container has a floor configured to accommodate outward sagging of the pellicle.

Accommodating sagging of the pellicle in this manner is advantageous because it avoids the pellicle touching the container, which would be liable to damage the pellicle.

According to a sixth aspect of the invention there is provided a mask provided with at least three protrusions configured to receive a pellicle frame attachment mechanism, wherein the protrusions are removably attached to the mask.

Making the protrusions removably attachable is advantageous because it allows the mask to be cleaned in a straightforward manner without the protrusions being present, following which the protrusions may be reattached to the mask.

The protrusions may be attached to substrate material of the mask.

According to a seventh aspect of the invention there is provided a method of making a pellicle assembly, the method comprising forming a membrane on a substrate and etching away substrate material to expose the membrane and thereby provide a pellicle membrane supported by a substrate perimeter, attaching a support frame to a portion of the substrate which borders the membrane, providing a first cover on one side of the substrate and a second cover on an opposite side of the substrate and clamping them together to form a sealed environment which contains the pellicle membrane.

The method is advantageous because the substrate provides support for the membrane and preserves tautness of the membrane, whilst the covers act to protect the membrane.

The first cover may be clamped against the substrate.

The cover second cover may be clamped against the substrate.

The method may further comprise cutting away parts of the substrate which project beyond the first and second covers.

The substrate may be a silicon wafer.

The second cover may cover the support frame such that the support frame is located within the sealed environment.

The first cover may include a recess configured to accommodate sagging of the pellicle membrane.

The method of making the pellicle assembly may be performed at a pellicle manufacturing location.

According to an eighth aspect of the invention there is provided a method comprising the above method of making the pellicle assembly, and further comprising forming a mask assembly by attaching a pellicle location tool to the support frame, removing the second cover from the pellicle assembly, attaching the support frame to a mask, and removing the first cover from the pellicle assembly using the pellicle location tool.

The pellicle location tool may include arms which are received in blind holes provided in the support frame.

The method of forming a mask assembly may be performed at a mask shop.

The method may further comprise putting the mask assembly inside a container and sealing that container.

According to a ninth aspect of the invention there is provided a pellicle assembly comprising a pellicle membrane extending from a substrate border portion, a support frame attached to the substrate border portion, a first cover and a second cover, wherein the first and second covers are provided on opposite sides of the substrate border portion and form a sealed environment which contains the pellicle membrane.

The sealed environment is advantageous because it prevents contamination from entering the environment and contaminating the pellicle membrane.

The second cover may cover the support frame such that the support frame is located within the sealed environment.

The first and second covers may be clamped against the substrate border portion.

According to a tenth aspect of the invention there is provided a method of monitoring a pellicle of a mask assembly, the mask assembly comprising a pellicle assembly and a mask, the method comprising measuring a property of the pellicle and monitoring for a change of the property which is associated with an increased risk of pellicle breakage, and when such a change is seen removing the pellicle assembly from the mask and replacing it with a new pellicle assembly.

The property of the pellicle may be measured when the mask assembly is in situ in the lithographic apparatus.

The property may be infra-red emission of the pellicle and/or may be deflection of the pellicle during scanning movement of the mask assembly.

The method may comprise transferring the mask assembly to a mask assembly inspection tool and then measuring the property of the pellicle using the mask assembly inspection tool.

One or more of the following measurement techniques may be used to measure one or more properties of the pellicle: EUV reflection measurements, EUV transmission measurements, ellipsometry, Raman spectroscopy, X-ray reflection measurements, microscope inspection, resonance measurements, scanning heat load measurements, pellicle deflection during pumpdown or venting.

The method may comprise removing the pellicle assembly from the mask, transferring the pellicle assembly to a pellicle assembly inspection tool and then measuring the property of the pellicle using the pellicle assembly inspection tool.

One or more of the following measurement techniques may be used to measure one or more properties of the pellicle: EUV transmission measurements (pellicle assembly removed from mask), EUV reflection measurements, birefringence measurements, ellipsometry, Fourier transform infra-red spectroscopy, Raman spectroscopy, X-ray reflection measurements, microscope inspection, resonance measurements, measurement of pellicle displacement due to pressure difference, deflection during pumpdown or/venting, scanning heat load measurements, frame deformation measurements.

Features of different aspects of the invention may be combined with features of other aspects of the invention.

BRIEF DESCRIPTION OF THE DRAWINGS

Embodiments of the invention will now be described, by way of example only, with reference to the accompanying schematic drawings, in which.

DETAILED DESCRIPTION

Figure 1:
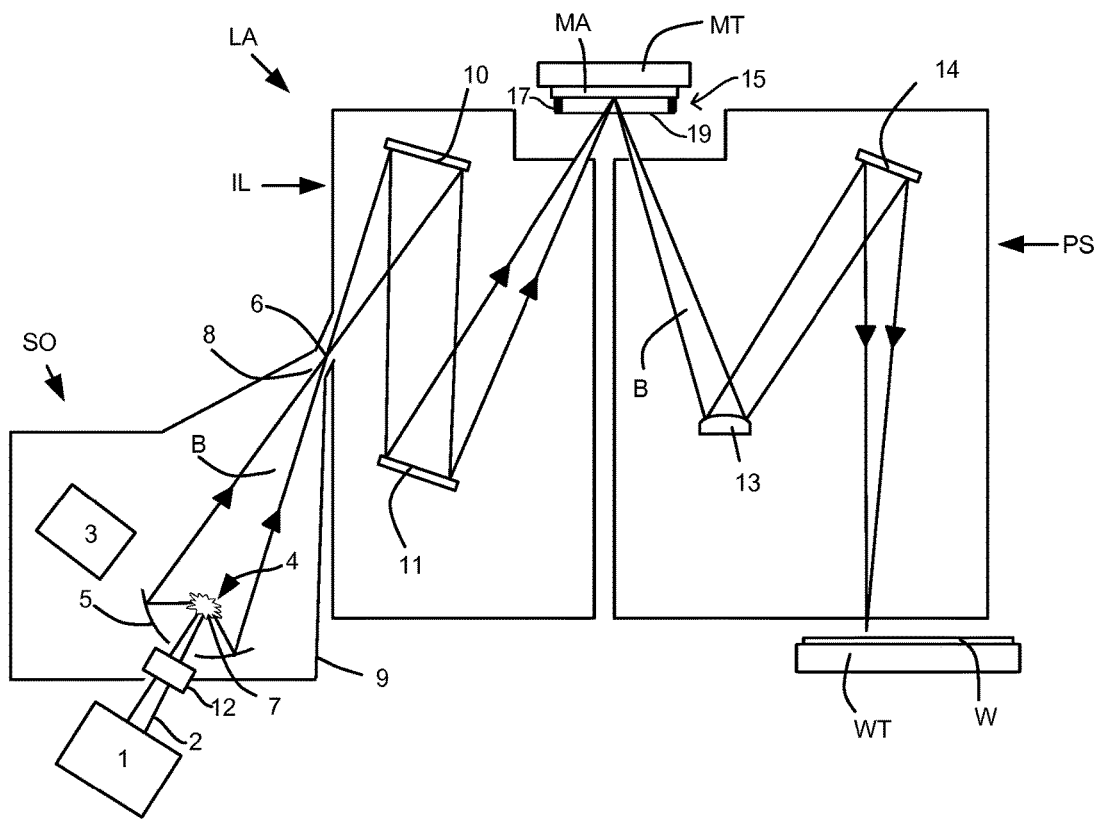
FIG. 1 is a schematic illustration of a lithographic system comprising a lithographic apparatus and a radiation source.

FIG. 1 shows a lithographic system including a mask assembly according to one embodiment of the invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a mask assembly 15 including a mask MA, a projection system PS and a substrate table WT configured to support a substrate W. The illumination system IL is configured to condition the radiation beam B before it is incident upon the mask MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g., hydrogen) may be provided in the radiation source SO. A vacuum may be provided in the illumination system IL and/or the projection system PS. A small amount of gas (e.g., hydrogen) at a pressure well below atmospheric pressure may be provided in the illumination system IL and/or the projection system PS.

The radiation source SO shown in FIG. 1 is of a type that may be referred to as a laser produced plasma (LPP) source. A laser 1, which may for example be a CO2 laser, is arranged to deposit energy via a laser beam 2 into a fuel, such as tin (Sn) that is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g., in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure that is arranged to reflect EUV radiation (e.g., EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

In other embodiments of a laser produced plasma (LPP) source the collector 5 may be a so-called grazing incidence collector that is configured to receive EUV radiation at grazing incidence angles and focus the EUV radiation at an intermediate focus. A grazing incidence collector may, for example, be a nested collector, comprising a plurality of grazing incidence reflectors. The grazing incidence reflectors may be disposed axially symmetrically around an optical axis O.

The radiation source SO may include one or more contamination traps (not shown). For example, a contamination trap may be located between the plasma formation region 4 and the radiation collector 5. The contamination trap may for example be a rotating foil trap, or may be any other suitable form of contamination trap.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the mask assembly 15 held by the support structure MT. The mask assembly 15 includes a mask MA and a pellicle 19, which is held in place by a pellicle frame 17. The mask MA reflects and patterns the radiation beam B. The illumination system IL may include other mirrors or devices in addition to or instead of the faceted field mirror device 10 and faceted pupil mirror device 11.

Following reflection from the mask MA the patterned radiation beam B enters the projection system PS. The projection system comprises a plurality of mirrors that are configured to project the radiation beam B onto a substrate W held by the substrate table WT. The projection system PS may apply a reduction factor to the radiation beam, forming an image with features that are smaller than corresponding features on the mask MA. A reduction factor of 4 may for example be applied. Although the projection system PS has two mirrors in FIG. 1, the projection system may include any number of mirrors (e.g., six mirrors).

The lithographic apparatus may, for example, be used in a scan mode, wherein the support structure (e.g., mask table) MT and the substrate table WT are scanned synchronously while a pattern imparted to the radiation beam is projected onto a substrate W (i.e., a dynamic exposure). The velocity and direction of the substrate table WT relative to the support structure (e.g., mask table) MT may be determined by the demagnification and image reversal characteristics of the projection system PS. The patterned radiation beam that is incident upon the substrate W may comprise a band of radiation. The band of radiation may be referred to as an exposure slit. During a scanning exposure, the movement of the substrate table WT and the support structure MT may be such that the exposure slit travels over an exposure field of the substrate W.

The radiation source SO and/or the lithographic apparatus that is shown in FIG. 1 may include components that are not illustrated. For example, a spectral filter may be provided in the radiation source SO. The spectral filter may be substantially transmissive for EUV radiation but substantially blocking for other wavelengths of radiation such as infra-red radiation.

In other embodiments of a lithographic system the radiation source SO may take other forms. For example, in alternative embodiments the radiation source SO may comprise one or more free electron lasers. The one or more free electron lasers may be configured to emit EUV radiation that may be provided to one or more lithographic apparatus.

As was described briefly above, the mask assembly 15 includes a pellicle 19 that is provided adjacent to the mask MA. The pellicle 19 is provided in the path of the radiation beam B such that radiation beam B passes through the pellicle 19 both as it approaches the mask MA from the illumination system IL and as it is reflected by the mask MA towards the projection system PS. The pellicle 19 comprises a thin film that is substantially transparent to EUV radiation (although it will absorb a small amount of EUV radiation). The pellicle 19 acts to protect the mask MA from particle contamination. The pellicle 19 may be herein referred to as an EUV transparent pellicle.

Whilst efforts may be made to maintain a clean environment inside the lithographic apparatus LA, particles may still be present inside the lithographic apparatus LA. In the absence of a pellicle 19, particles may be deposited onto the mask MA. Particles on the mask MA may disadvantageously affect the pattern that is imparted to the radiation beam B and the pattern that is transferred to the substrate W. The pellicle 19 advantageously provides a barrier between the mask MA and the environment in the lithographic apparatus LA in order to prevent particles from being deposited on the mask MA.

The pellicle 19 is positioned at a distance from the mask MA that is sufficient that any particles that are incident upon the surface of the pellicle 19 are not in the focal plane of the radiation beam B. This separation between the pellicle 19 and the mask MA, acts to reduce the extent to which any particles on the surface of the pellicle 19 impart a pattern to the radiation beam B. It will be appreciated that where a particle is present in the beam of radiation B, but at a position that is not in a focal plane of the beam of radiation B (i.e., not at the surface of the mask MA), then any image of the particle will not be in focus at the surface of the substrate W. In some embodiments, the separation between the pellicle 19 and the mask MA may, for example, be between 2 mm and 3 mm (e.g. around 2.5 mm).

Figure 2:
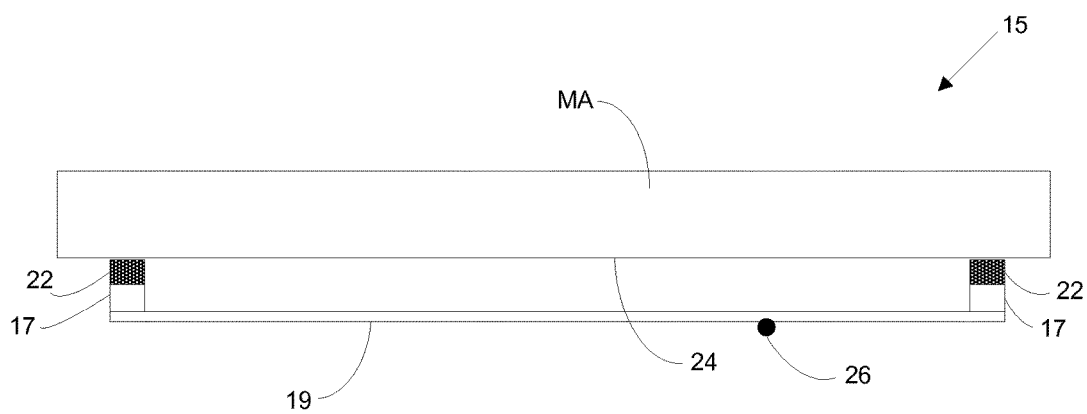
FIG. 2 is a schematic illustration of a mask assembly according to an embodiment of the invention.

FIG. 2 depicts the mask assembly 15 in cross-section and in more detail. The mask MA has a patterned surface 24. The pellicle frame 17 which supports the pellicle 19 is provided with an attachment mechanism 22. The attachment mechanism 22 may be configured to allow the pellicle frame to be removably attachable to the mask MA (i.e. to allow the pellicle frame to be attachable to and detachable from the mask). The attachment mechanism 22 is configured to engage with an attachment feature (not shown) provided on the mask MA. The attachment feature may, for example, be a protrusion which extends from the mask MA. The attachment mechanism 22 may, for example, comprise a locking member which engages with the protrusion and secures the pellicle frame 17 to the mask MA.

A plurality of attachment mechanisms and associated attachment features may be provided. The attachment mechanisms may be distributed around the pellicle frame 17 (e.g. two on one side of the frame and two on an opposite side of the frame). Associated attachment features may be distributed around the perimeter of the mask MA.

The attachment mechanism 22 may suspend the pellicle frame 17 relative to the mask MA. That is, there may be a separation between the pellicle frame 17 and the mask MA, such that a gap exists between them through which gas may flow into and out of the space between the pellicle 19 and the mask. The gap may be in the form of a slit which extends round the perimeter of the pellicle frame 17, the slit being interrupted by attachment mechanisms which connect the pellicle frame to the mask MA. The separation between the pellicle frame 17 and the mask MA may for example be between 200 microns and 300 microns. Since this separation is relatively narrow, the flow of gas into and out of the space between the pellicle 19 and the mask MA is restricted.

In an alternative embodiment, the attachment mechanism may be such that the pellicle frame 17 is in contact with the mask MA.

As noted above, a plurality of attachment mechanisms and associated attachment features may be provided. Each attachment mechanism may for example comprise a locking member and each associated attachment feature may comprise a protrusion (which may be referred to as a stud). The locking members and protrusions may form kinematic connections between the pellicle frame and the mask. This may allow the pellicle frame to be mounted on the mask without causing significant distortion of the mask.

The attachment mechanism may be configured to avoid lateral sliding motion between the attachment mechanism and the attachment feature when attaching the mask frame to the mask, including also no sliding motion at the subsequent pellicle attachment after mask inspection has occurred. Avoiding such sliding motion provides the advantage that contamination particles which might otherwise be generated are avoided.

Figure 3:
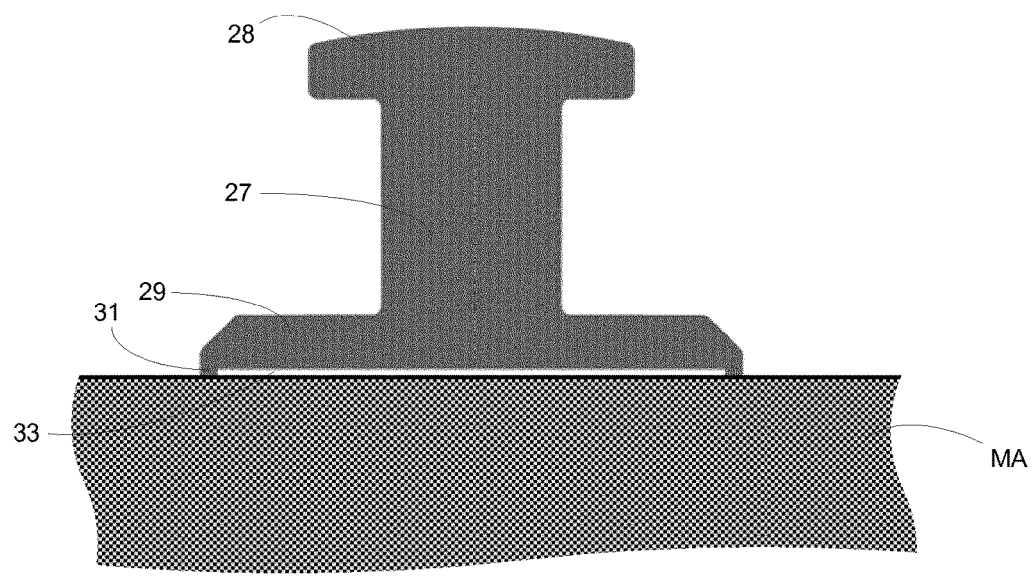
FIG. 3 is a schematic illustration of a protrusion which forms part of the mask assembly shown in FIG. 2.

In an embodiment, depicted in FIG. 3, the protrusion 27 extends from the mask MA and includes a distal head 28. The locking member may be configured to engage the protrusion 27 (stud) beneath the distal head 28 and thereby secure the pellicle frame to the mask. The attachment mechanism may include a resilient feature which is configured to bias the locking member against the stud. The locking member may be disengaged from the stud by applying force against the resilient bias.

Although FIG. 3 depicts a protrusion 27 extending from the face of the mask MA, in an embodiment protrusions may instead be provided on sides of the mask. In an embodiment, some protrusions may be provided on sides of the mask and some protrusions may be provided on the face of the mask.

As may be seen from FIG. 3, in an embodiment the protrusion includes a base 29 which is fixed to the mask MA. A lip 31 is provided on a bottom surface of the base, the lip defining a recess 33 in the surface of the base. Glue is provided in the recess 33 to secure the base 29 to the mask MA. The volume of glue provided in the recess is less than the volume of the recess, and when the base is pressed against the mask MA the glue remains fully within the recess. The lip 31 is held against the mask MA by the glue because the glue shrinks as it dries and thereby pulls the base 29 towards the mask MA. Consequently, the recess and the mask MA together define a substantially enclosed space which retains the glue. This is advantageous because outgassing of glue into a clean environment is substantially avoided.

Gluing of the protrusion to the mask MA may however be achieved in any other suitable manner. In another embodiment a groove, for example a substantially U-shaped groove, may be provided for venting in the base of the protrusion. In such case the U-shaped groove defines (together with the mask MA) an island in the base surface of the protrusion. The glue will be drawn in to the groove by capillary action and will secure the protrusion to the mask MA while the groove is still partially open for some glue outgassing.

In yet another embodiment wherein the protrusion has lip 31 defining recess 33, for venting it is sufficient to have one or more openings in the lip 31 such that recess 33 is partially open for some glue outgassing.

In the above embodiments the groove in the base of the protrusion or the opening in the protrusion lip 31 is arranged such that outgassing of the glue is prevented from directly entering the space between the pellicle and the mask. Therefore, although some outgassing of the glue may occur over time, the outgassing will occur towards the outer side of the pellicle frame and thus will not cause significant contamination of the pellicle or the patterned mask area which may be sensitive to contamination, thereby preventing haze on the mask.

The volume of glue used may for example be around 50 microns. The glue may for example be Araldite® type from Huntsman Advanced Materials, an epoxy adhesive such as Epotec® or any other EUV suitable soft or hard glue.

In an embodiment in which the protrusion 27 extends from the face of the mask MA, the protrusion may be located a few millimeters away from the patterned surface of the mask. In such an embodiment, material which outgasses from the base 29 of the protrusion 27 may be incident upon the patterned surface of the mask MA and may cause defects in projected patterns. In such circumstances, avoiding outgassing of the glue which secures the protrusion 27 to the mask MA is particularly advantageous. Providing glue in a substantially enclosed space which retains the glue (as described above) provides this advantage.

The bonding between the protrusion 27 and the mask may be permanent or temporary. The protrusion may be fixed to the mask MA for example with an adhesive (e.g. as described above), or by using other means. For example, the protrusion may be fixed to the mask using a mechanical attachment such as screws or clamps, via electrostatic or magnetic forces induced to attract the protrusions to the mask, via optical bonding (using the van der Waals adhesion force) or any other suitable means. Preferably the attachment of the protrusion to the mask is done in a manner which allows the protrusion to be is easily and cleanly removable (e.g. so that substantially no particles or outgassing molecules and species are released which could deposit on the mask MA). In an alternative embodiment, the protrusions may be integral part of the mask MA (i.e. non-removable).

A multilayer stack of material may be provided across the mask MA to provide EUV reflectivity. This multilayer stack may be partially covered with an EUV absorbing layer, this partial covering providing the mask with a pattern to be projected onto substrates by the lithographic apparatus. An outer border of the mask may be provided with other patterns which are not projected onto substrates but instead have other uses. For example, these patterns may include alignment marks and may indicate the identity of the mask.

In an embodiment (which may be combined with any other embodiment described in this document), a portion of the surface of the mask MA to which the protrusion 27 is attached does not include a multilayer stack of material or an EUV absorbing layer. Instead these are removed from that portion of the surface of the mask MA (or were never present at that portion of the surface of the mask). Consequently, the protrusion is attached directly to the material from which the mask is formed. This may be referred to as attaching the protrusion to substrate material of the mask (or equivalently referred to as attaching the protrusion to the mask substrate). The mask substrate may for example be formed from glass. The mask substrate may for example be formed from Low Thermal Expansion Material (LTEM).

Attaching the protrusion in this way is advantageous because the strength of the connection between the protrusion 27 and the mask MA is not influenced by material properties of the multilayer stack or the absorbing layer. Instead the connection is determined only by the material of the mask substrate. A further advantage is that because the protrusion 27 is not attached to the multilayer stack or the absorbing layer, damage to those layers and consequent generation of contamination particles when attaching the protrusion is avoided.

An additional advantage is that it is easier to remove the protrusion 27 and glue from the mask MA at a later time if this becomes necessary. In particular, any glue removal process does not risk damaging the multilayer stack or the absorbing layer because these are not present where the glue is located. Again, this avoids consequent generation of contamination particles.

In an alternative arrangement the attachment mechanism(s) may be provided on the mask and the attachment features(s) may be provided on the pellicle frame.

A contamination particle 26 is schematically shown in FIG. 2. The contamination particle 26 was incident upon the pellicle 19 and is held by the pellicle. The pellicle 19 holds the contamination particle sufficiently far from the patterned surface 24 of the mask MA that it is not imaged onto substrates by the lithographic apparatus LA.

The pellicle 19 may, for example, be formed from a material such as polysilicon (pSi) film. Polysilicon (pSi) film is substantially transparent to EUV radiation. The pellicle 19 may alternatively be formed from some other material which is substantially transparent to EUV radiation, for example graphene, silicene, etc. By EUV transparent pellicle or a film substantially transparent for EUV radiation herein is meant that the pellicle 19 transmits at least 65% of incident EUV radiation, preferably at least 80% and more preferably at least 90% of incident EUV radiation. A capping layer which may help to reduce the effect of hydrogen radicals, plasma and traces of oxygen on the pellicle 19 may be provided. The capping layer may be provided both on the pellicle and on the pellicle frame.

A mask assembly according to an embodiment of the invention may provide a mask pattern which remains substantially defect free during use (the mask pattern is protected from contamination by the pellicle). As noted above, a separation may be provided between the pellicle frame and the mask (e.g. in the form of slits) which allow some gas to flow into and out of the space between the pellicle and the mask. This allows pumping down and venting of the mask assembly to be performed without damaging the mask assembly.

Figure 4:
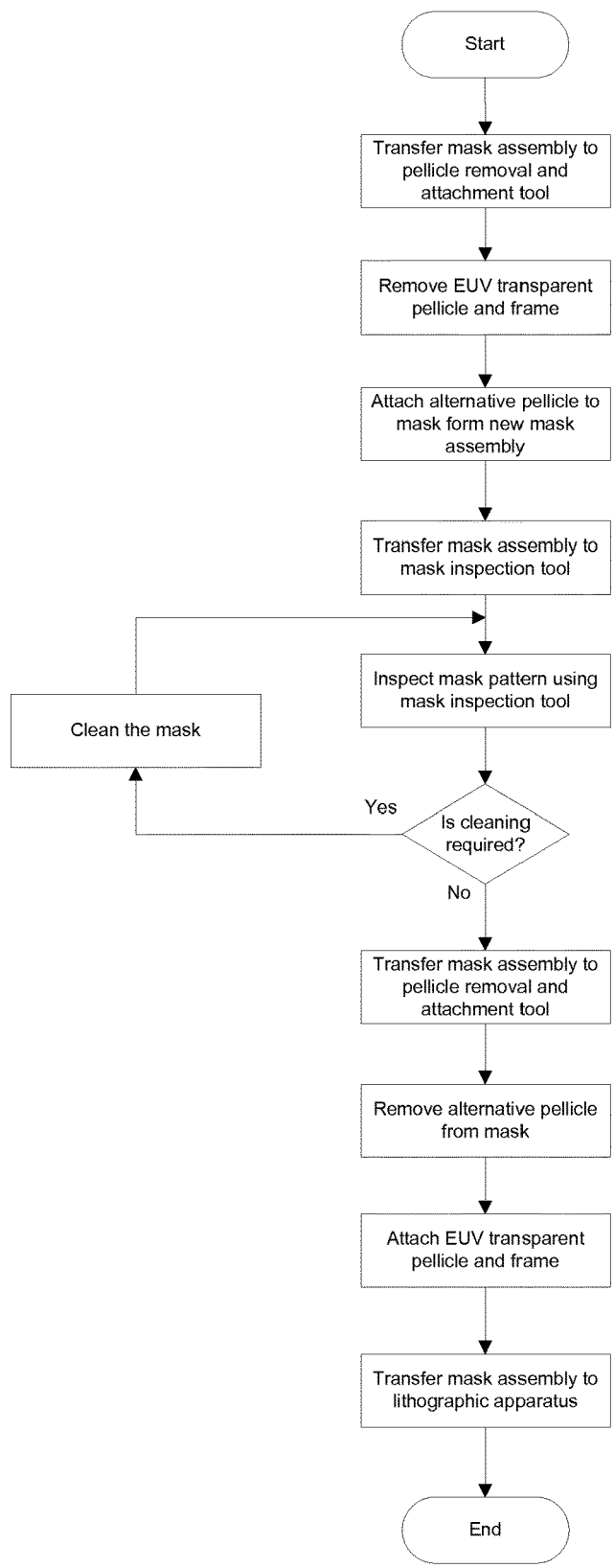
FIG. 4 is a process flow which depicts a method according to an embodiment of the invention.

FIG. 4 is a process flow which illustrates handling of a mask assembly to allow inspection of the mask pattern by a mask inspection tool. Although the pellicle 19 is substantially transparent to EUV radiation, it may be substantially opaque to an inspection beam used by the mask inspection tool (or at least not sufficiently transparent to allow the mask inspection tool to inspect the mask pattern correctly). The process flow addresses this problem. The mask inspection tool may for example use as an inspection beam a radiation beam at a non-EUV wavelength (e.g. DUV, VIS or IR radiation). The mask inspection tool may for example use as an inspection beam a particle beam such as an electron beam (e-beam).

The mask assembly is transferred from a lithographic apparatus to a pellicle removal and attachment tool. Inside the pellicle removal and attachment tool a controlled clean environment is provided. The pellicle removal and attachment tool includes attachment mechanism actuators which are configured to disengage the attachment mechanisms 22 (see FIG. 2) from the mask MA. These actuators are used to disengage the attachment mechanisms 22, and the pellicle frame 17 (with the EUV transparent pellicle 19) is then removed from the mask MA.

An alternative pellicle is then attached to the mask MA. The alternative pellicle is formed from a different material to the EUV transparent pellicle. The alternative pellicle may be formed from a material such as an amorphous fluoropolymer (e.g. Teflon AF or Cytop) and is substantially transparent to an inspection beam used by the mask inspection tool (e.g. a DUV radiation beam or e-beam). The term "substantially transparent to an inspection beam" is intended to mean that the alternative pellicle transmits the inspection beam sufficiently well to allow an inspection of the mask to be performed. The alternative pellicle may for example transmit at least 80% of the inspection beam, more preferably at least 90% of the inspection beam.

The alternative pellicle may be attached to the same attachment features as used to attach the EUV transparent pellicle to the mask MA. In another arrangement, the alternative pellicle may be attached to the mask MA using alternative attachment features which are used solely for receiving the alternative pellicle and is not used for the EUV transparent pellicle. The alternative attachment features may be provided further away from the patterned area of the mask than the attachment features used by the EUV transparent pellicle. Using alternative attachment features is advantageous because it avoids the possibility of the EUV transparent pellicle attachment features being damaged when attaching the alternative pellicle (the EUV transparent pellicle attachment features are untouched when the attaching the alternative pellicle). Providing the alternative attachment features further away from the patterned area of the mask is advantageous because it reduces the risk of contamination particles travelling from the attachment features to the patterned area. The alternative attachment features may for example be provided on sides of the mask MA.

The alternative pellicle may be provided with attachment mechanisms configured to engage with the alternative attachment features provided on the mask MA. The alternative attachment mechanisms may for example be provided on a frame which supports the alternative pellicle.

Since the alternative pellicle is in place during inspection of the mask by a mask inspection tool, the alternative pellicle may be referred to as an inspection-compatible pellicle (since it is substantially transparent to the inspection beam). The alternative pellicle may also be referred to as a temporary pellicle.

The mask assembly, which now comprises the mask together with the alternative pellicle, is then transferred to the mask inspection tool. The mask inspection tool checks for contamination on the mask pattern. If contamination is found, then cleaning of the mask MA may be performed to remove the contamination. The alternative pellicle may be removed in order to allow the mask to be cleaned (e.g. using the pellicle removal and attachment tool). The attachment features (e.g. protrusions) may remain in place on the mask MA during this cleaning of the mask. This includes the attachment features used to receive the EUV transparent pellicle, and may also include attachment features used to receive the alternative pellicle (if such attachment features are present). Following cleaning, the alternative pellicle may be reattached to the mask MA (e.g. using the pellicle removal and attachment tool). The mask assembly is returned to the mask inspection tool where a further inspection is performed to check that the contamination has been removed.

The mask assembly is then transferred from the mask inspection tool to the pellicle removal and attachment tool. The pellicle removal and attachment tool then removes the alternative pellicle from the mask MA.

A pellicle frame and EUV transparent pellicle is then attached to the mask MA. This may be the same pellicle frame and pellicle that was previously removed from the mask MA, or may be a new pellicle frame and pellicle. If the same pellicle frame and pellicle is reused, then the pellicle may be cleaned before being reattached to the mask MA.

The mask assembly 15, which now comprises a mask MA, pellicle frame 17 and EUV transparent pellicle 19 is then transferred to a lithographic apparatus. The lithographic apparatus is used to project patterns from the mask MA onto substrates.

The mask inspection tool and the pellicle removal and attachment tool may be integrated with each other in order to minimize transportation of the mask assembly.

The alternative pellicle may be a DUV-transparent pellicle, or any suitable pellicle (i.e. inspection-compatible or a temporary pellicle) for use in place of the EUV transparent pellicle. The alternative pellicle may be substantially transparent to a radiation beam or particle beam (e.g. e-beam) used by a mask inspection tool.

In an alternative approach the pellicle frame 17 and EUV transparent pellicle 19 may be removed from the mask MA using the pellicle removal and attachment tool and then passed to the mask inspection tool without attaching an alternative pellicle to the mask. Following inspection of the mask MA by the mask inspection tool the pellicle frame 17 and EUV transparent pellicle 19 may be re-attached to the mask by the pellicle removal and attachment tool (or a new pellicle frame 17 and EUV transparent pellicle 19 may be attached). Although this approach allows inspection of the mask it includes the disadvantage that the mask is not protected by a pellicle during inspection of the mask, or during transfer to and from the mask inspection tool. The mask inspection tool may for example have a less closely controlled clean environment than the environment of the pellicle removal and attachment tool or the environment of a lithographic apparatus. A contamination particle could for example adhere to the mask MA after inspection and before the pellicle frame 17 and EUV transparent pellicle 19 are attached to the mask. Since this occurred after mask inspection the contamination particle would not be detected and would lead to defects in patterns projected on substrates. This disadvantage is avoided by the method shown in FIG. 4 because the mask MA is protected by a pellicle during mask inspection and during transfer to and from the mask inspection tool. The mask MA is only unprotected during swapping between the EUV transparent pellicle and the alternative (e.g. DUV-transparent) pellicle, which is a small part of the process. The environment provided in the pellicle removal and attachment tool may be closely controlled (e.g. more closely controlled than other environments) given that this is the only environment in which mask MA is unprotected.

In an embodiment, the mask MA may be fitted with an alternative pellicle rather than an EUV transparent pellicle during periods of non-use. The alternative pellicle may for example comprise a DUV-transparent pellicle. DUV-transparent pellicle materials may suffer less from outgassing than EUV transparent pellicle materials, and thus less contamination due to outgassing over time may be expected when storage of a mask assembly with a DUV-transparent pellicle is used.

Although described above in the context of removing a pellicle frame from a mask and subsequently re-attaching the pellicle frame, the pellicle removal and attachment tool may also be used to attach a pellicle frame to a mask which has not previously been provided with a pellicle.

During the process depicted in FIG. 4 the mask assembly is at all times held in a clean environment. The interior of the pellicle removal and attachment tool is a controlled clean environment, as is the interior of the mask inspection tool. Transfer of the mask assembly between the pellicle removal and attachment tool and the mask inspection tool may be achieved in one of two ways. The pellicle removal and attachment tool may be connected to the mask inspection tool by a port which directly connects them together. The port is sealed from the exterior environment. The port may connect the controlled clean environments of these two tools together, thereby allowing the mask assembly to travel directly from the pellicle removal and attachment tool to the mask inspection tool without leaving the controlled clean environment.

In an alternative approach the mask assembly may be placed in a container which provides a clean environment, and may then be transferred from the pellicle removal and attachment tool to the mask inspection tool inside the container. The interior of the container may be connected to the controlled clean environment of the pellicle removal and attachment tool, such that the mask assembly can be placed into the container (e.g. using a suitable handler) without leaving the controlled clean environment. The container is then sealed such that a clean environment is maintained within the container. The container is then taken to the mask inspection tool. At the mask inspection tool the clean environment within the container is connected to the controlled clean environment within the mask inspection tool, and the mask assembly is then transferred into the mask inspection tool. The above steps are reversed to transfer the mask assembly back to the pellicle removal and attachment tool.

The container may also be used to provide a clean environment for transfer of a pellicle assembly comprising a pellicle and pellicle frame. For example, a pellicle assembly may be transported to the pellicle removal and attachment tool using the container.

In an embodiment there is provided a container with an exchangeable view window which is arranged to be assembled with the mask into a mask assembly (or into a pellicle assembly) in the lithographic apparatus. By providing an exchangeable film (an exchangeable view window) to the container which will be transferred to the scanner or inspection tools, the mask will be constantly protected. The main exposure to particles takes place in such case in a controlled environment, when the reticle is exchanged between containers. The protective exchangeable film may be chosen to be transparent for EUV during exposure time, and exchanged to be transparent for inspection when provided to the inspection apparatus. The bottom side of the container, in vicinity of the exchangeable film, can be closed to protect the fragile film. During inspection the mask with protective film is loaded to a reticle stage and the exchangeable film is chosen to be compatible with the light source used during inspection. Then the mask is changed from a container A (with film suitable for inspection) to container B (with film suitable for exposure) in a clean environment to minimize particles. During exposure the mask with protective film is loaded to the reticle stage and the exchangeable film is chosen to be compatible with light source used during exposure.

Figure 5:
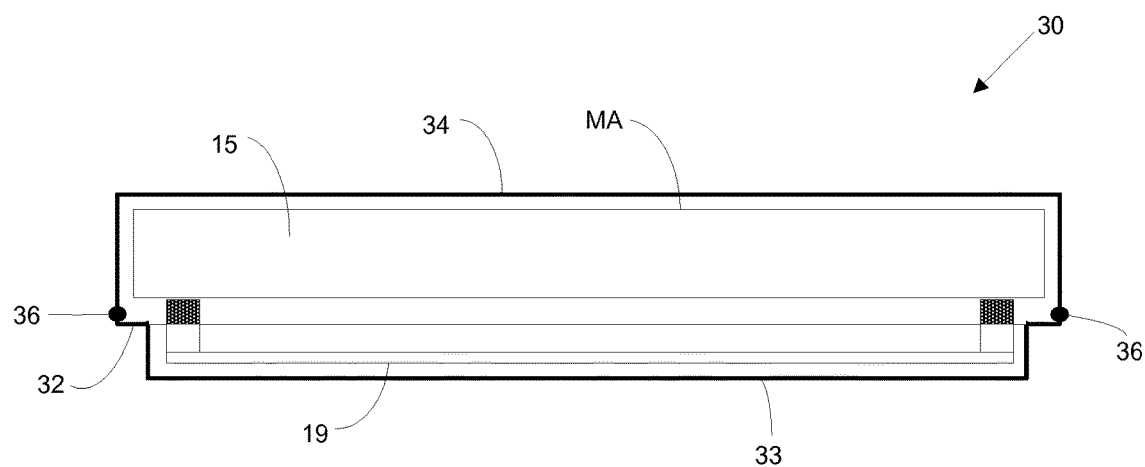
FIG. 5 is a schematic illustration of a mask assembly and container according to an embodiment of the invention.

An example of a container which may be used to transfer a mask assembly (or a pellicle assembly) between controlled clean environments is shown schematically in FIG. 5. The container 30 has a shape which generally corresponds with the shape of the mask assembly 15. The container 30 includes a plate 32 which includes a recessed portion 33. The recessed portion 33 is spaced apart from the pellicle 19 to accommodate some sagging of the pellicle. The separation between the recessed portion 33 and the plane of the pellicle may for example be between around 0.5 mm and around 1 mm (e.g. around 0.7 mm or more). The term 'plane of the pellicle' may be interpreted as referring to a plane which corresponds with edges of the pellicle and in which the pellicle would lie if it did not suffer from sagging.

Outward sagging of the pellicle 19 may occur if the pressure in the space between the pellicle 19 and the mask MA is greater than the pressure outside of that space. This may occur if the pressure in the controlled clean environment of the container 30 is being reduced, because although there may be slits between the pellicle frame 17 and the mask MA these slits may be relatively small and may restrict the flow of gas. Outward sagging of the pellicle 19 may also occur due to gravity.

The container 30 may correspond generally with known containers configured to transport an EUV mask without a pellicle, except that the known containers do not include a recess 33. The depth of the recess 33 may for example be around 3 mm. This accommodates the pellicle frame 17 and pellicle 19, which as noted above may have a height between around 2 mm and around 2.5 mm, and provides space to accommodate outward sagging of the pellicle.

The container 30 further comprises a cover 34 which may be placed over the mask assembly 15. The cover has the form of an open box (i.e. a box with no lid). The plate 32 acts as a floor which comes together with the cover 34 to form the container 30 which encloses the mask assembly 15. A seal 36 is provided between the plate 32 and the cover 34, the seal acting to isolate the interior of the container from the external environment. The seal 36 may have any suitable form (the depicted black discs are merely illustrative).

Any suitable opening form of opening may be used to allow the mask assembly 15 to be placed inside the container 30.

The container 30 may be used to transport the mask assembly 15 (or a pellicle assembly) between locations which are at vacuum and locations which are not at vacuum. The vacuum and non-vacuum locations may all be controlled clean environments. For example, the pellicle removal and attachment tool may be not at vacuum, and the mask inspection tool may be not at vacuum. Where this is the case, the container may take the mask assembly 15 (or the pellicle assembly) from a vacuum environment (e.g. inside a lithographic apparatus) to a non-vacuum environment and vice versa.

The container 30 may include a port (not shown) through which gas can be introduced to bring the interior of the container from a vacuum up to atmospheric pressure. As noted further above, although there may be slits between the pellicle frame 17 and the mask MA, these may be relatively small and may restrict the flow of gas into the space between the pellicle 19 and the mask MA. When gas is being introduced into the container 30 sagging of the pellicle 19 towards the mask MA may take place. However, the separation between the plane of the pellicle 19 and the mask MA is arranged to be sufficiently large that the pellicle will not come into contact with the mask. The flow of gas into the container 30 may be controlled to ensure that the difference between pressures on either side of the of the pellicle 19 remains below a desired threshold level (which may be sufficiently low that it avoid the possibility of the pellicle touching the mask MA and also avoids breaking the pellicle).

Gas may be pumped out of the port as desired in order to provide a vacuum within the container 30 prior to transferring the mask assembly 15 to a lithographic apparatus. The gas may be pumped out at a rate which is sufficiently low that the difference between pressures on either side of the of the pellicle 19 remains below a desired threshold level (the threshold may be sufficiently low that it avoid the possibility of the pellicle touching the container 30 and avoids breaking the pellicle).

In an embodiment in which the pellicle assembly is being transported without the mask MA, pressure build-up on one side of the pellicle may not happen. Nevertheless, sagging of the pellicle 19 may still occur, for example due to gravity. The recess 33 of the container 30 may have a depth which is larger than the extent to which the pellicle will sag. This prevents touching of the pellicle against the container and potential resulting damage to the pellicle. The depth of the recess 33 may for example be around 3 mm.

Figure 6:
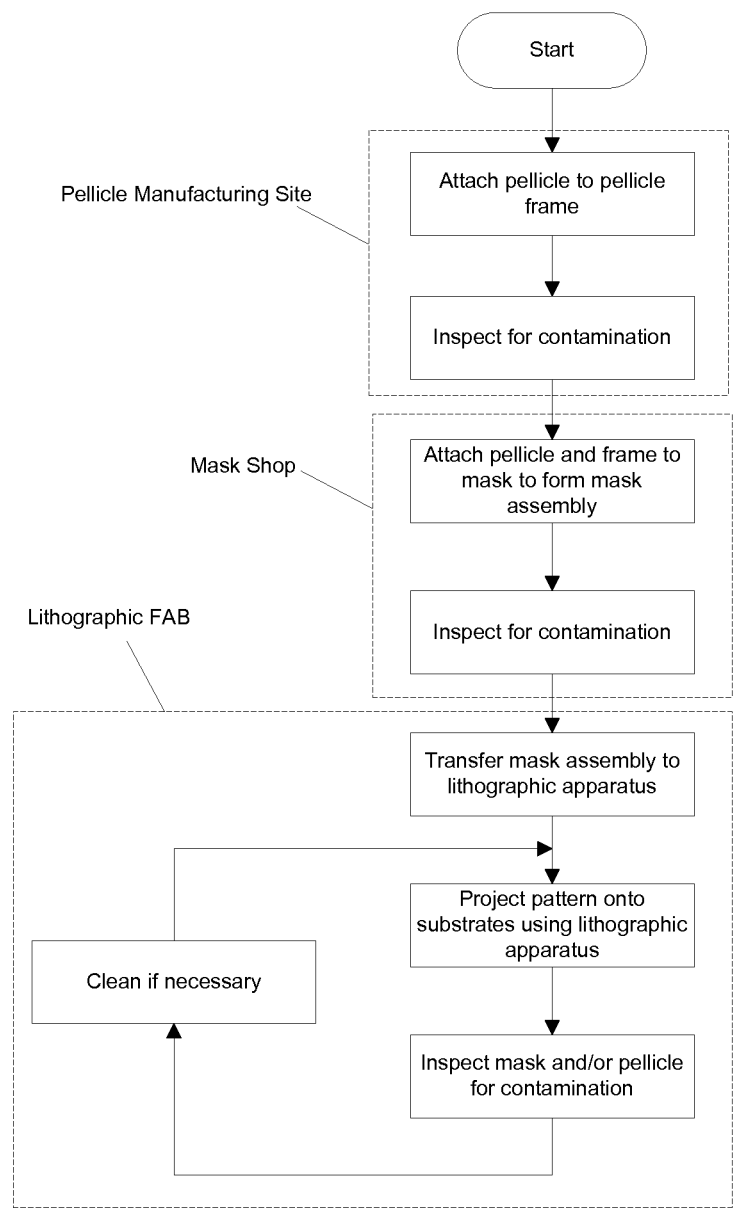
FIG. 6 is a process flow which depicts a method according to an embodiment of the invention.

FIG. 6 is a process flow which illustrates at high level steps of a method according to an embodiment of the invention. As depicted in FIG. 6, some of those steps may be performed at a pellicle manufacturing site, some steps may be performed at a mask manufacturing site (which may be referred to as a mask shop), and some steps may be performed at a lithographic FAB (where integrated circuits may be fabricated).

At the pellicle manufacturing site a pellicle is formed from a suitable material such as polysilicon and is bonded (e.g. glued) to a pellicle frame. The pellicle and pellicle frame are then inspected for contamination. If contamination is found, then the pellicle and pellicle frame are cleaned to remove that contamination. The pellicle and pellicle frame are then transported in a container which provides a clean environment to the mask shop. The container may, for example, correspond with the container described above in connection with FIG. 5.

At the mask shop a mask is manufactured. This includes providing a pattern on the mask which is subsequently to be projected onto substrates by a lithographic apparatus. The pellicle frame is secured to the mask to form a mask assembly which comprises the pellicle, pellicle frame and mask. The mask assembly is then inspected for contamination. If contamination is found, then the mask assembly is cleaned to remove the contamination (for example the pellicle is removed, the mask is cleaned and the same or a new pellicle is reattached). The mask assembly is then placed in a container which provides a clean controlled environment and is transported to a lithographic FAB. The container may, for example, correspond with the container described above in connection with FIG. 5.

At the lithographic FAB the mask assembly is transferred from the container into a lithographic apparatus. The lithographic apparatus projects the pattern from the mask onto substrates in a conventional manner. The mask assembly is periodically inspected for pellicle contamination and/or mask contamination. Inspection for pellicle contamination may, for example, take place within the lithographic apparatus (however it also may be done in an independent tool outside of the lithographic apparatus). Inspection of the mask pattern may, for example, be performed using a mask inspection tool. The mask assembly may be cleaned as necessary and then used again to project patterns onto substrates.

Figure 7:
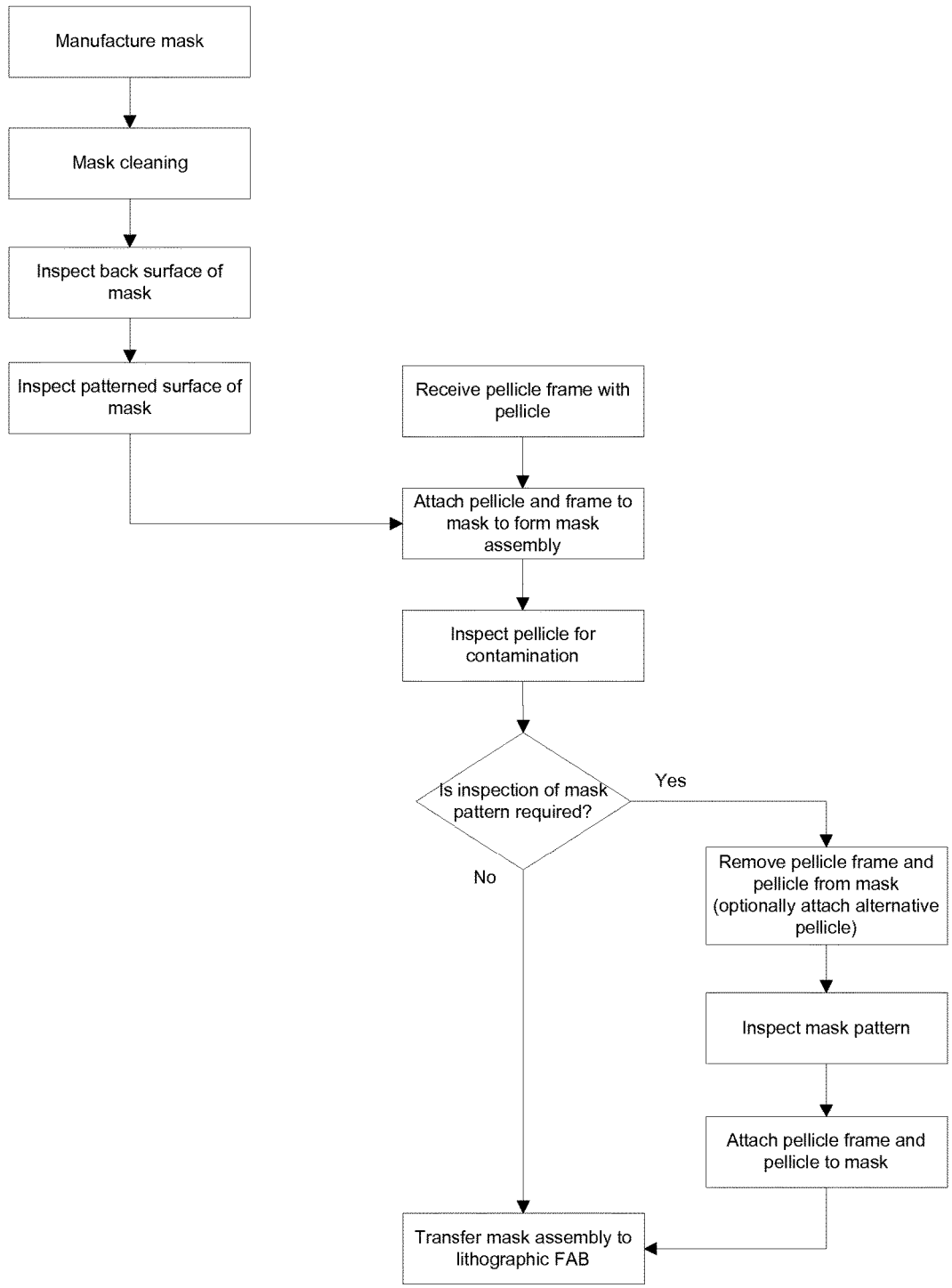
FIG. 7 is a process flow which depicts a method according to an embodiment of the invention.

FIG. 7 shows in more detail the mask assembly manufacturing steps which may be performed at the mask shop. A mask is manufactured in a conventional manner. The mask is a reflective mask for use in an EUV lithographic apparatus. Following manufacture the mask is cleaned in order to remove contamination which may have been generated during manufacture of the mask. The back surface of the mask is then inspected for contamination (a contamination particle on the back surface of the mask may cause unwanted localized distortion of the mask during use). The patterned surface of the mask is then inspected for contamination (as noted above such contamination may introduce defects into a projected pattern). In an embodiment, the order of the inspection may be reversed, i.e. first inspect the patterned surface and then the back surface. In an embodiment one of the inspections may be skipped (e.g. the back surface is not inspected).

A pellicle mounted on a pellicle frame is received from a pellicle manufacturer. The pellicle is attached to the mask to form a mask assembly. Attaching the pellicle frame to the mask may comprise engaging an attachment mechanism to an attachment feature (although any other bonding/attachment form is also possible). The attachment mechanism may comprise a locking member configured to engage with a protrusion. In an embodiment, a plurality of projections (e.g. studs) may extend from the mask. The pellicle frame may be provided with locking members which engage with the protrusions and secure the pellicle frame to the mask. The protrusions may be provided on the front and/or on sides of the mask.

The pellicle of the mask assembly is inspected for contamination. Attaching/removing the pellicle frame to the mask and inspecting the pellicle for contamination may be performed by the same tool. Although mentioned here in relation to the mask shop this may also be the case in the lithographic FAB.

The pellicle may be removed and cleaned if contamination is found. Inspection of the mask pattern may be required. If this is not required, then the mask assembly is placed in a container for transportation to the lithographic FAB. The container may, for example, correspond with the container described above in connection with FIG. 5.

If inspection of the mask pattern is required, then this may be performed using a method which corresponds with that described above in connection with FIG. 4. That is, the pellicle and pellicle frame (which are EUV transparent) may be removed and replaced with an alternative pellicle. This will allow inspection of the mask pattern using a mask inspection tool (as explained further above). The inspection may be performed without removing the protrusions from the mask. Following inspection of the mask pattern, the alternative pellicle is replaced with the EUV transparent pellicle. The resulting mask assembly may then be transported to the lithographic FAB in a container.

As noted in FIG. 7, and as described further above, inspection of the mask pattern may be performed with no pellicle being present (i.e. neither the (EUV transparent pellicle nor an alternative pellicle are present). A disadvantage of this approach is that contamination may be introduced onto the mask pattern whilst the pellicle is not present. The inspection may be performed without removing the protrusions from the mask.

If contamination is found then the mask is cleaned to remove the contamination. Cleaning of the mask may be performed without a pellicle being present. The protrusions may remain on the mask during cleaning of the mask. The protrusions may be permanently bonded to the mask (i.e. the protrusions are a non-removable part of the mask).

In some cases it may be desirable to remove the protrusions from the mask as part of the mask cleaning process. If the protrusions have been attached to the mask by glue then the process used to remove the protrusions may depend upon the form of glue that was used to attach the protrusions. If the glue is a soft glue (i.e. a dissolvable glue) then the protrusions may be removed from the mask by dissolving the glue. This also removes the glue from the mask. If the glue is a hard glue (i.e. does not dissolve in solvents which are compatible with the mask) then the protrusions are mechanically removed from the mask. The hard glue is then mechanically removed from the mask. In alternative embodiments, as mentioned above, other forms of bonding of the protrusions are envisaged, such as magnetic or electrostatic attachment, optical bonding, or mechanical clamping. Where these are used the protrusions are removed using an appropriate technique (e.g. when electrostatic attachment is used the voltage used to provide the attachment is removed).

Once the protrusions and the glue have been removed from the mask the mask cleaning of the mask is performed. Replacement protrusions may then be glued onto the mask to receive a pellicle frame and pellicle. Inspection of the mask pattern for contamination may be performed before and/or after the protrusions have been glued to the mask. The pellicle may be inspected for contamination before and/or after it has been attached to the mask.

Figure 8:
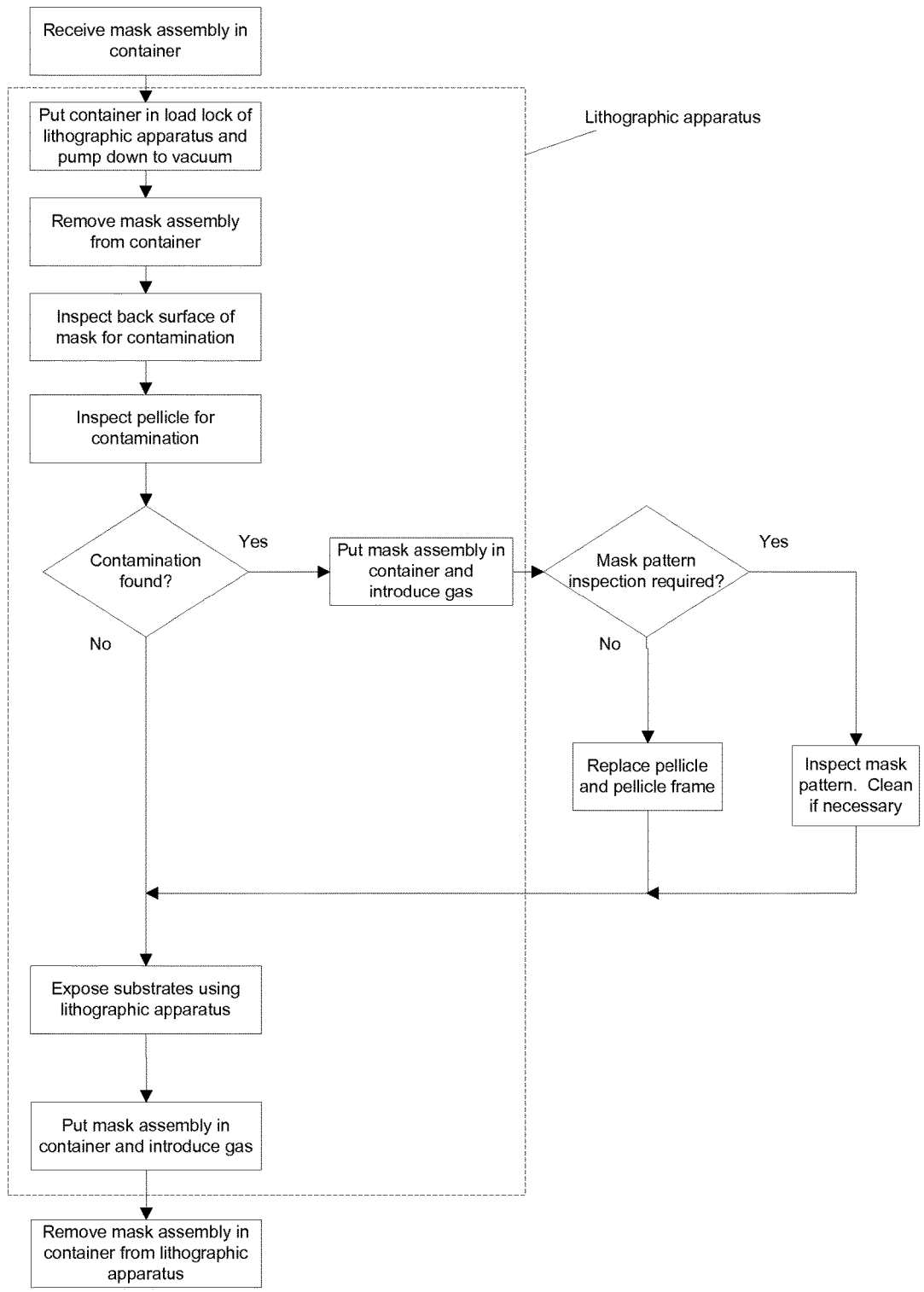
FIG. 8 is a process flow which depicts a method according to an embodiment of the invention.

FIG. 8 depicts in more detail the process performed in the lithographic FAB. Parts of the process which are performed inside a lithographic apparatus are identified by a dashed line.

A mask assembly held in a container (which may correspond with the container described above in connection with FIG. 5) is received at the lithographic apparatus. The container is put into a load-lock of the lithographic apparatus and is pumped down to a vacuum. The mask assembly is then removed from the container. The back surface of the mask is inspected for contamination using an inspection tool located inside the lithographic apparatus. The pellicle is inspected for contamination using an inspection tool located in the lithographic apparatus. If no contamination is found then the mask is used by the lithographic apparatus to project patterns onto substrates.

Once exposure of substrates has been completed the mask assembly is put back into the container in the load lock. Gas is introduced into the container and the load lock, and the container and mask assembly are removed from the lithographic apparatus.

If contamination is found then the mask assembly is removed from the lithographic apparatus. This involves placing the mask assembly back into the container in the load lock, then introducing gas into the container and the load lock. The mask assembly and container are then removed from the load lock. The next steps then depend upon the nature of the contamination that was found. If contamination was only found on the pellicle, then the pellicle may be replaced with a new pellicle (and pellicle frame). This may be performed in a pellicle removal and attachment tool as described further above.

If contamination on the mask pattern is suspected or found to be present (or contamination on the back surface of the mask), then an inspection of the mask using a mask inspection tool may be performed. This may be followed by cleaning of the mask to remove the contamination. Cleaning of the mask may be performed with the protrusions remaining in place on the mask. Following cleaning of the mask a further inspection of the mask may then be performed using the mask inspection tool. If the mask is found to be free of contamination, then a pellicle and frame are attached to the mask and the mask is then transported in a container to the lithographic apparatus.

If the cleaning has not removed the contamination, then the mask is returned to the mask shop for further cleaning. This further cleaning may be performed with the protrusions remaining in place. Alternatively, the protrusions may be removed before the further cleaning takes place.

A tool which removes and attaches pellicles to a mask may be separate from a pellicle inspection tool. Alternatively, a single tool may be provided which removes and attaches pellicles to a mask and also inspects pellicles.

FIG. 9 schematically shows a method of making a pellicle assembly according to an embodiment of the invention. Referring first to FIG. 9A a pellicle is formed on a silicon wafer 50. Chemical vapour deposition (CVD) is used to deposit polysilicon onto the wafer 50. Capping material may be deposited on top of the polysilicon. A rectangular area of the silicon wafer 50 is then etched away, leaving behind a thin layer of polysilicon supported by a silicon wafer perimeter. The thin layer of polysilicon, which may be referred to as a membrane, forms a pellicle 52. The thin layer of polysilicon may for example have a thickness of less than 100 nm, and may for example have a thickness of around 50 nm. In an embodiment, the pellicle may measure around 80 mm by 80 mm.

The presence of the silicon wafer 50 around the perimeter of the pellicle 52 is advantageous because it provides a rigid frame which preserves tautness of the pellicle 52. The pellicle 52 is taut when it is created due to the manner in which it is formed. The nature of crystallization of the polysilicon causes some shrinkage of the polysilicon. This shrinkage removes wrinkles from the pellicle 52 and gives it tautness (which may be considered to be a pre-stressing of the pellicle). If the wafer 50 did not provide a rigid frame to support the pellicle 52, and instead a frame with flexibility was provided, then the tautness of the pellicle 52 would bend the frame inwards. As a result of this inward bending the tautness of the pellicle 52 would be lost. The remaining steps of the method allow the outer portion of the wafer 50 to be removed without tautness of the pellicle 52 being lost. It tautness of the pellicle 52 were to be lost then uncontrolled sagging of the pellicle would occur and wrinkles would be seen in the pellicle.

A portion of the wafer 50 which extends around the outer edge of the membrane of the pellicle 52 may be referred to as a border portion 55 of the pellicle (an outer edge of the border portion is indicated by a dashed line).

Figure 9A:
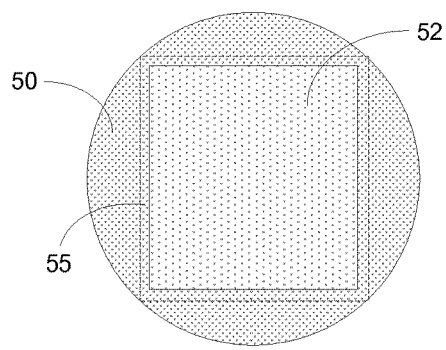
FIGS. 9A-9D schematically depict a method of making a pellicle assembly.
Figure 9B:
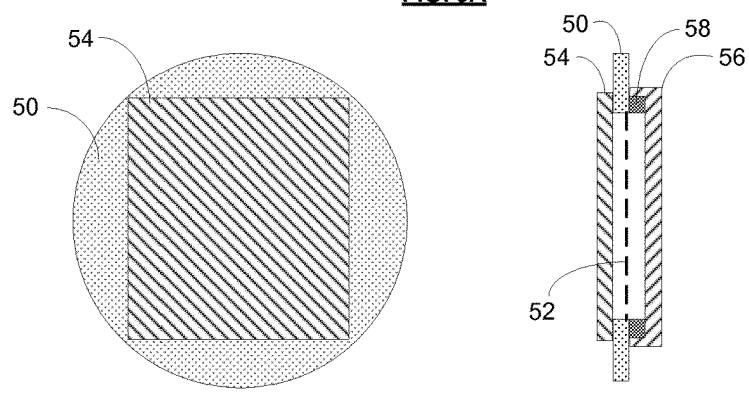

FIG. 9B schematically shows covers which are clamped to the wafer 50. The drawing on the left hand side of FIG. 9B shows a top side cover 54 and the wafer 50 viewed from above. The drawing on the right hand side of FIG. 9B shows the top side cover 54, wafer 50 and other components viewed in cross-section. The top side cover 54 is pressed against the border portion 55 on the side of the pellicle which will be furthest from a mask in use.

The dashed line on the right hand side of FIG. 9B indicates the location of the membrane of the pellicle 52. In this embodiment the membrane of the pellicle 52 at the bottom side of the wafer 50. This is because the etch that was used to remove the rectangular area of the wafer was applied to the top side of the wafer. In such an embodiment there is a clearance between the membrane of the pellicle 52 and the top side cover 54. The top side cover 54 may therefore have a flat inner surface. In an alternative embodiment the membrane of the pellicle 52 is at the top side of the wafer 50 (the etch was applied to the bottom side of the wafer). In such an embodiment there is no clearance between the membrane of the pellicle 52 and the top side cover 54, and the top side cover will therefore include a recess to accommodate sagging of the pellicle.

A frame 58 and a bottom side cover 56 are provided on the opposite side of the wafer 50. The frame 58 is fixed to the border portion 55. The frame 58 is sufficiently rigid that it is capable of resisting inward bending and thus can preserve tautness of the pellicle 52. The frame 58 may be fixed to the border portion 55 using glue or any other suitable means. The bottom side cover 56 is pressed against the wafer 50 and covers both the bottom side of the pellicle membrane 52 and the frame 58.

From FIG. 9B it may be seen that the top side cover 54 covers the pellicle membrane 52 on the top side, and the bottom side cover 56 covers the pellicle membrane on the bottom side. Thus, between them the covers 54, 56 form a sealed enclosure which contains the pellicle membrane 52. The top side cover 54 and the bottom side cover 56 and frame 58 are fitted to the wafer 50 in clean conditions in order to minimize the possibility of contamination being introduced into the environment of the pellicle membrane 52 when they are attached to the wafer 50. Indeed, the entire process of fabricating the pellicle and then fitting the frame 58 and covers 54, 56 may be performed in clean conditions.

Figure 9C:
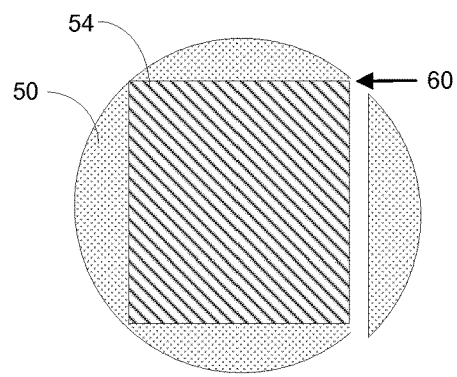

As schematically depicted in FIG. 9C, a cutting tool (e.g. a milling machine) is used to trim away parts of the wafer 50 which extend beyond the bottom side cover 56. In FIG. 9C the right hand portion of the wafer 50 has already been removed. The top portion of the wafer 50 is about to be removed by cutting in the direction indicated by the arrow 60. Other portions of the wafer 50 will then be removed. Because the pellicle membrane 52 is contained within a sealed environment this cutting away of the wafer does not risk introducing contamination onto the pellicle membrane.

Figure 9D:
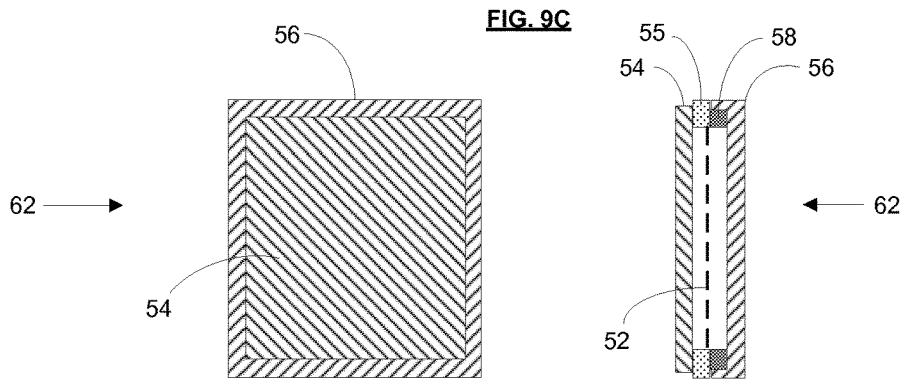

Once the edges of the wafer 50 have been trimmed away, the remaining assembly is a pellicle assembly 62 as shown in FIG. 9D. The pellicle assembly comprises a pellicle membrane 52, a substrate border portion 55, a frame 58, a top side cover 54 and a bottom side cover 56. The pellicle assembly 62 holds the pellicle membrane 52 in a sealed environment into which contamination cannot enter. The frame 58 supports the pellicle and maintains its tautness.

In the illustrated embodiment the bottom side cover 56 covers the frame 58. This is advantageous in embodiments in which holes are provided in the frame. Such holes are intended to allow the passage of gas during use of the pellicle, but contamination could pass through the holes to the pellicle membrane 52 during other times. The bottom side cover 56 prevents this from happening by providing a seal between the bottom cover and the substrate border portion 55 which isolates the holes from the external environment.

The top side cover 54 and bottom side cover 56 are pressed against the substrate border portion 55 by one or more clamps. The one or more clamps may be of conventional construction.

The steps described and illustrated in connection with FIG. 9 provide a pellicle assembly 62 which maintains pellicle tautness and prevents pellicle contamination. The pellicle assembly 62 may, for example, be manufactured at a single location. This is advantageous compared with, for example, manufacturing a pellicle at a first manufacturing location and then transporting that pellicle to a second location to be fitted on to a supporting frame (contamination might be introduced during transportation to the second location).

The pellicle assembly 62 may, for example, be shipped from the pellicle manufacturing location to a mask shop where the pellicle is fitted to a mask for use by a lithographic apparatus. FIG. 10 shows schematically a process for attaching the pellicle to a mask. The process may, for example, be performed at a mask shop (i.e. a factory where a patterned mask is created).

Figure 10A:
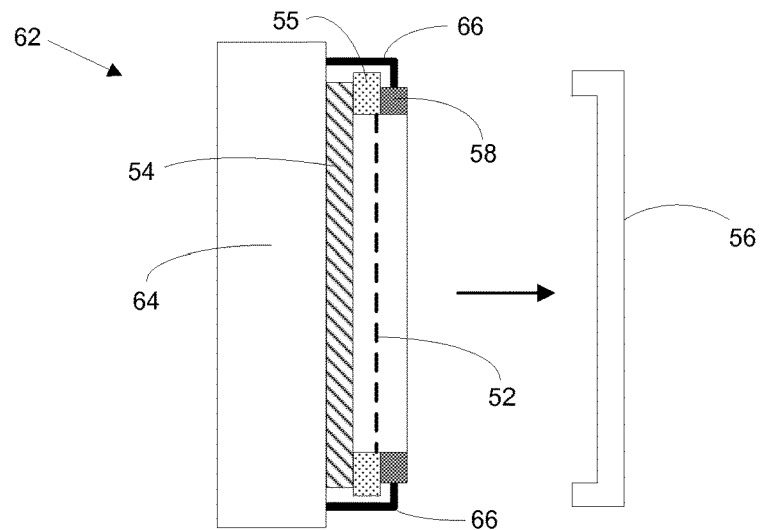
FIGS. 10A-10C schematically depict a method of forming a mask assembly using the pellicle assembly.

In a first step (not illustrated) the pellicle assembly 62 is cleaned in order to remove contamination from the outside of the pellicle assembly. Following cleaning the pellicle assembly 62 is held in a clean environment to avoid contamination being incident upon the pellicle assembly. Within the clean environment, a pellicle placement tool 64 is attached to the frame 58. The pellicle placement tool 64 includes arms 66 which are received in blind bores provided in the frame 58 (i.e. openings provided on an outer surface of the frame which do not pass fully through the frame). The pellicle placement tool 64 securely holds the frame 58 and presses the top side cover 54 against the substrate border portion 55 (thereby holding the top side cover 54 in place). Once the pellicle placement tool has been attached to the frame 58 the one or more clamps which are pressing the covers 54, 56 against the border portion 55 are removed. The bottom side cover 56 can then be removed from the frame 58 as depicted in FIG. 10A. As depicted, the bottom surface of the pellicle membrane 52 is thereby exposed. The frame 58 is also exposed.

Figure 10B:
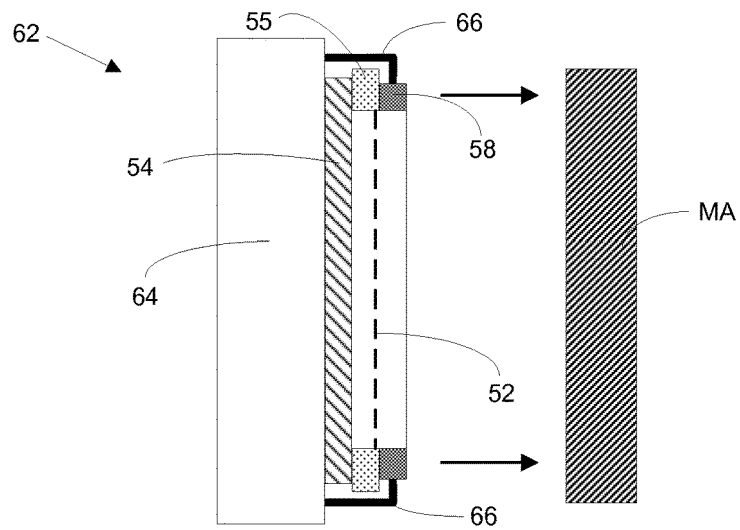

Referring to FIG. 10B, the pellicle placement tool 64 is used to position the pellicle membrane 52 and frame 58 relative to a mask MA and to press the frame 58 on to the mask. The frame 58 may be secured to the mask MA in any suitable manner. This may for example comprise attaching the frame to attachment features which are provided on the mask MA (as described further above). The pellicle placement tool 64 is then removed. This takes with it the top side cover 54.

Figure 10C:
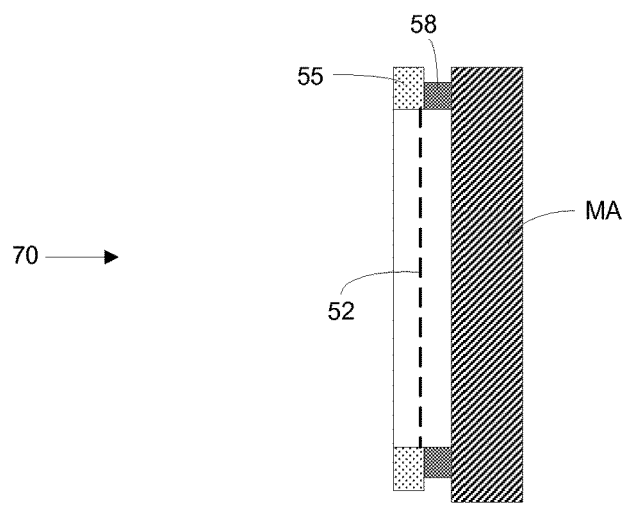

The resulting assembly 70, which may be referred to as a mask assembly, is shown in FIG. 10C. The mask assembly 70 comprises a mask MA to which a pellicle frame 58 and pellicle 52 are secured. The mask assembly 70 may be stored and/or transported in a suitable container (which may, for example, correspond with the mask assembly container described further above).

Although FIGS. 9 and 10 describe the embodiment of the invention in terms of a silicon wafer 50, other suitable substrates may be used.

Figure 11:
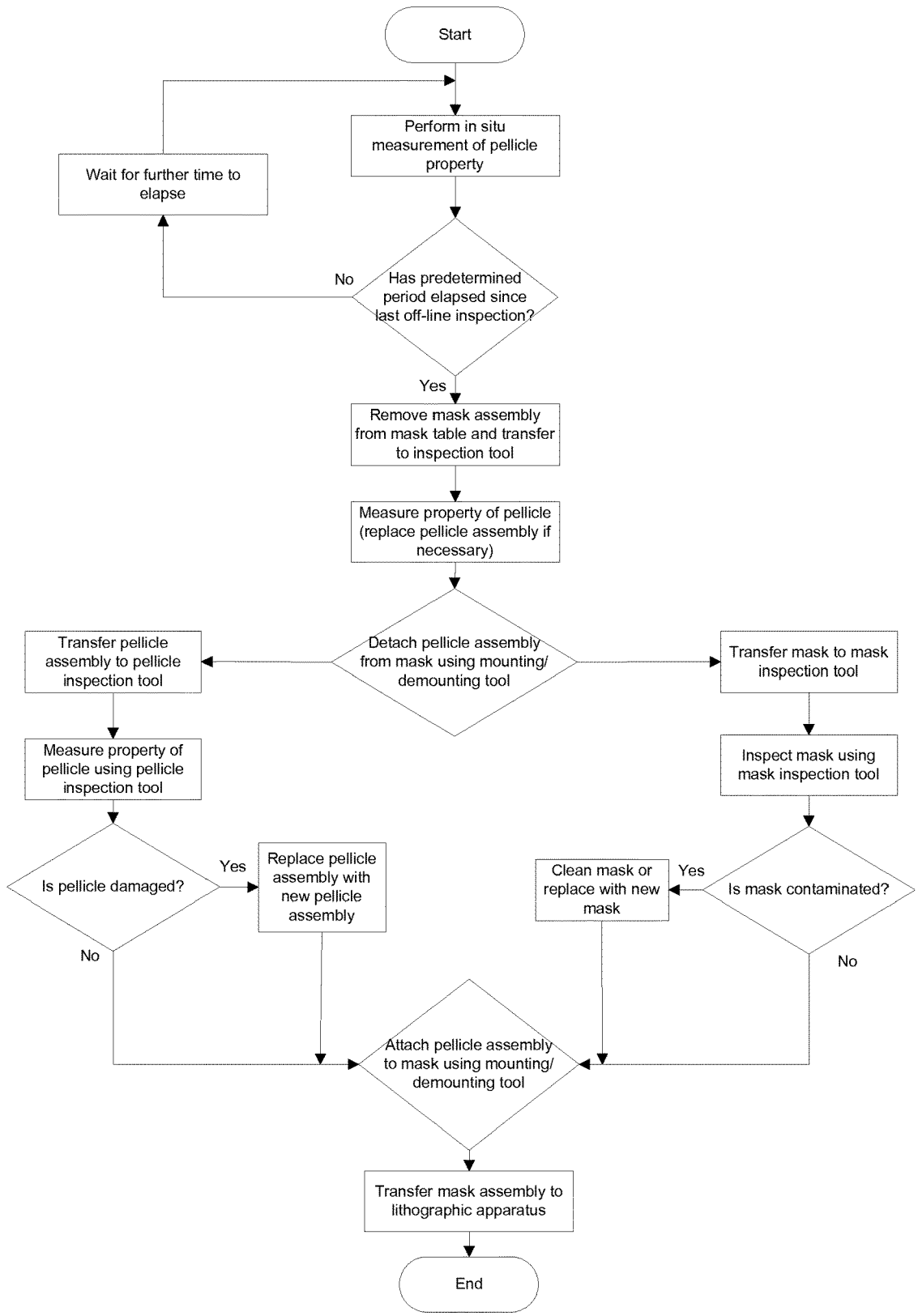
FIG. 11 is a process flow which depicts a method according to an embodiment of the invention.

FIG. 11 schematically depicts a method of monitoring a pellicle according to an embodiment of the invention. The method begins with a mask assembly which is being used in a lithographic apparatus to expose substrates.

A first step of the method is in situ measurement of a property of the pellicle (or more than one property of the pellicle). Referring to FIG. 1, in situ measurement of a property of the pellicle means a measurement which is performed when the mask assembly 15 is being held by the support structure MT. If a change of the property is seen which is associated with an increased risk of pellicle breakage, then the pellicle assembly is removed from the mask and replaced with a new pellicle assembly.

In an embodiment, an situ measurement of the pellicle may be performed using an infra-red sensor. During exposure of a substrate the pellicle is heated by EUV radiation which is absorbed by the pellicle. Consequently, the pellicle will emit infra-red radiation, with the wavelength of that radiation being linked to the temperature of the of the pellicle. If the wavelength of the infra-red radiation shifts to a shorter wavelength, then this indicates that the temperature of the pellicle has increased. A significant temperature increase of the pellicle may indicate damage to the pellicle which increases the risk of the pellicle breaking. Therefore, the mask assembly is removed from the lithographic apparatus, and the pellicle assembly replaced with a new pellicle assembly.

In an embodiment, deformation of the pellicle which occurs during scanning movement of the mask assembly may be measured. The deformation may for example be a deflection of the pellicle towards the mask, and may for example be determined by using a lateral shear interferometer to measure wavefront aberrations in EUV radiation which has passed through the pellicle. An increase or decrease of the deformation, for example compared with deformation observed when the mask assembly was first subjected to scanning movement, indicates a change of the stress of the pellicle. If the increase or decrease of the stress of the pellicle corresponds with an increased risk of pellicle breakage then the mask assembly is removed from the lithographic apparatus and the pellicle assembly is replaced with a new pellicle assembly.

The next step of the method is determining whether a predetermined period has elapsed since the last off-line inspection. The term "off-line" may be interpreted as meaning an inspection which takes place when the pellicle assembly is not in situ in the lithographic apparatus (i.e. when the mask assembly is not being held by the support structure). The predetermined period may be based upon the statistical likelihood of the pellicle becoming damaged as a function of time.

When the predetermined period has elapsed the mask assembly is transferred to a mask assembly inspection tool. This may comprise removing the mask assembly from the lithographic apparatus. The mask assembly may be placed in a container (e.g. corresponding with the container 30 depicted in FIG. 5) for transfer from the lithographic apparatus to the mask assembly inspection tool.

The mask assembly inspection tool inspects the mask assembly to monitor for damage of the pellicle. The mask assembly inspection tool measures a property (or more than one property) of the pellicle. If a change of the property is seen which is associated with an increased risk of pellicle breakage during operation of the lithographic apparatus (e.g.

the pellicle is found to be damaged), then the pellicle assembly is removed from the mask assembly and replaced with a new pellicle assembly.

If the pellicle is not found to be damaged by the mask assembly inspection tool, then the pellicle assembly (i.e. pellicle and pellicle frame) may be detached from the mask using a pellicle frame detachment tool (e.g. as described further above). Following this detachment the pellicle assembly is handled separately from the mask. The pellicle assembly is transferred to a pellicle inspection tool. The pellicle assembly may be located in a sealed container during this transfer. The mask is transferred to a mask inspection tool. The mask may be held in a sealed container during this transfer. Inspection of the pellicle assembly by the pellicle inspection tool may be performed in parallel with inspection of the mask by the mask inspection tool.

The pellicle inspection tool measures a property (or more than one property) of the pellicle. If a change of the property is seen which is associated with an increased risk of pellicle breakage during operation of the lithographic apparatus (e.g. the pellicle is found to be damaged), then the pellicle assembly is removed from the mask assembly and replaced with a new pellicle assembly. For example, if the pellicle is found to be damaged then the pellicle assembly may be replaced with a new pellicle assembly.

If the mask is found to be contaminated then the mask is cleaned in order to remove the contamination. If cleaning of the mask does not remove the contamination then the mask is replaced with a new mask.

Once the pellicle has been confirmed as being undamaged (or has been replaced with a new pellicle), the mask and the pellicle assembly are transported to the mounting/demounting tool (e.g. using sealed containers) where the pellicle assembly is mounted on the mask. The pellicle assembly is then transported back to the lithographic apparatus (e.g. in a sealed container). Exposure of substrates using the mask assembly can then be performed by the lithographic apparatus.

Embodiments of the invention monitor for damage of the pellicle which causes an increased risk of pellicle breakage (which may be referred to as pellicle failure) during subsequent operation of the lithographic apparatus. When such damage is found the pellicle assembly is removed and replaced with a different pellicle assembly. This is advantageous because it minimizes the risk of a pellicle failing during operation of the lithographic apparatus. Pellicle failure during operation of the lithographic apparatus is undesirable because it could cause contamination of the mask and/or the lithographic apparatus.

In an embodiment (not depicted in FIG. 11), inspection of the mask assembly (e.g. inspection of the pellicle in situ on the mask) may be performed more frequently than separate inspection of the pellicle assembly. Where this is the case, if the inspection of the mask assembly does not find pellicle damage associated with an increased risk of pellicle breakage, then the mask assembly may be returned to the lithographic apparatus LA without separation of the mask and pellicle assembly and additional inspection thereof.

The mask assembly inspection tool may use one or more of the following measurement techniques to measure one or more properties of the pellicle: EUV reflection measurements, EUV transmission measurements, ellipsometry, Raman spectroscopy, X-ray reflection measurements, microscope inspection, resonance measurements, scanning heat load measurements, pellicle deflection during pumpdown or venting. These are each described below:

EUV reflection measurements—EUV radiation is directed onto the pellicle and a sensor monitors for localized variations in the reflection of the pellicle. A localized variation in EUV reflection is indicative of a deterioration (or other change) of capping material on the pellicle. This deterioration or change of the capping material is indicative of a breakage risk of the pellicle. If such a deterioration or other change is found then the pellicle assembly is removed from the mask and is replaced. EUV reflection measurements may also monitor for global variations in the reflection of the pellicle. Again, a variation in EUV reflection (compared with a reference value of reflection, which may be a previously measured value) is indicative of a deterioration or other change of the capping material on the pellicle. Again, if such a variation is seen then the pellicle assembly is removed from the mask and replaced.

EUV transmission measurements (pellicle in situ on mask)—an EUV radiation beam is directed onto the pellicle. EUV radiation which passes through the pellicle is reflected by the mask and passes back out through the pellicle. This reflected EUV radiation is monitored. The monitoring may be done by measuring and mapping the EUV radiation before the mask assembly is used, and then comparing a subsequently measured map with the initial map. Differences between the maps indicate either a change in the pellicle or a change in the mask. The nature of the differences may be used to discriminate a change of the pellicle from a change of the mask. If a significant change of the pellicle is seen then the pellicle assembly may be replaced. If a significant change of the mask is seen then the mask may be cleaned.

Ellipsometry—this technique measures changes in the reflection of the pellicle over a range of wavelengths. If the measured spectrum of reflected radiation changes (e.g. compared with a previously performed reference measurement) then this is indicative of changes in material properties of the pellicle (e.g. oxidation). These changes may indicate an increased risk of pellicle breakage. In addition, the changes of material properties may impact the optical performance of the pellicle during lithographic exposure. Thus, when changes in material properties of the pellicle are determined by ellipsometry then the pellicle assembly is replaced.

Raman spectroscopy—this technique measures local changes in the stress of the pellicle. Raman spectroscopy is a spectroscopic technique based on inelastic scattering of monochromatic light. The monochromatic light may be provided from a laser source. When photons undergo inelastic scattering from the pellicle the frequency of those photons changes. The change in frequency of the photons depends upon stress in the pellicle. Therefore, changes of stress in the pellicle can be observed using Raman spectroscopy. A change of stress in the pellicle may indicate an increased risk of pellicle breakage. A change of stress in the pellicle may be a global change or may be a localized change. A localized change of stress may be referred to as a stress concentration. The pellicle assembly is replaced if a changes of stress in the pellicle is seen that indicates an increased risk of pellicle breakage.

X-ray reflection measurements—this technique directs a beam of x-rays onto the pellicle at a grazing incidence angle, and measures the intensity of the specular reflection of the x-rays from the pellicle. The intensity of the reflected x-rays is analyzed to determine one or more of the density, thickness or roughness of the pellicle. The roughness may be surface roughness of the pellicle or roughness of an interface between material layers of the pellicle. A significant deviation of any of the density, thickness or roughness from values expected in an undamaged pellicle may indicate an increased risk of pellicle breakage. Where this is the case, the pellicle assembly is removed and replaced with a new pellicle assembly.

Microscope inspection—a microscope may be used to inspect for local defects in the pellicle. The inspection may be manual or may be automated, e.g. using image analysis software to monitor for defects in the pellicle. The inspection may determine the number and/or size and/or shape of particles and/or holes in the pellicle. If particles are found or if a hole is found which gives rise to an increased risk of pellicle breakage, then the pellicle assembly is removed and replaced with a new pellicle assembly. For example, if a hole is found in the pellicle then this may give rise to an unacceptable risk of pellicle breakage when pumping the mask assembly down to a vacuum or venting the mask assembly (significant pressure differences on either side of the pellicle may occur during pumping or venting). Replacing the pellicle assembly prevents such a breakage from occurring.

Resonance measurements—a vibration is applied to the pellicle assembly, the frequency of the vibration being adjusted until a resonant frequency is found. This may be done before using the mask assembly when it is known that the pellicle is not damaged. During subsequent inspection of the pellicle assembly a vibration is again applied to the pellicle assembly. A deviation of the resonant frequency from the previously observed resonant frequency is indicative of a global change in the stress of the pellicle and/or a change in the stress in some other part of the mask assembly. If a change of resonant frequency is observed which is indicative of damage associated with an increased risk of pellicle failure then the pellicle assembly is replaced.

Scanning heat load measurements—in this technique a source of heat such as a laser beam is scanned over the pellicle. At the same time the temperature of the pellicle is measured, for example using a pyrometer. The pyrometer may be used to identify localized hot areas on the pellicle (i.e. areas which are hotter than the rest of the pellicle). If a localized hot area, which may be referred to as a hotspot, is seen then this may be indicative of an increased risk of failure of the pellicle. Where this is the case the pellicle assembly is removed and replaced. The heat delivered to the pellicle will cause a wrinkling pattern to be generated on the pellicle. The period (or other features) of this wrinkling pattern is linked to the stress of the pellicle. Therefore, the wrinkling pattern may be analyzed to determine whether the stress of the pellicle is such that there is a an increased risk of failure of the pellicle. If an increased risk of failure is present then the pellicle assembly is removed and replaced.

Pellicle deflection during pumpdown or venting—the mask assembly may be transferred to a chamber which can be pumped down to a vacuum or can be vented to atmospheric pressure. The chamber may be initially at atmospheric pressure when it receives the mask assembly. The chamber is then pumped down to a vacuum in a controlled manner. As explained further above in connection with FIG. 2, a gap exists between the pellicle frame and the mask but the gap is relatively narrow and restricts the flow of gas. As a result, the when the chamber is being pumped down to vacuum the pressure between the pellicle and mask will be higher than the pressure of the chamber. This pressure difference will cause outward deflection of the pellicle, which is measured using a suitable sensor (e.g. a camera). The chamber may subsequently be vented to atmospheric pressure in a controlled manner. This will cause inward deflection of the pellicle, which again may be measured using a suitable sensor (e.g. a camera). The degree of deflection of the pellicle is dependent upon the stress of the pellicle. A deflection which falls outside of predetermined threshold values may indicate an increased risk of pellicle failure.

Inspection of the pellicle when the pellicle assembly has been removed from the mask may comprise one or more of the following methods: EUV transmission measurements, EUV reflection measurements, birefringence measurements, ellipsometry, Fourier transform infra-red spectroscopy, Raman spectroscopy, X-ray reflection measurements, microscope inspection, resonance measurements, measurement of pellicle displacement due to pressure difference, pellicle deflection during pumpdown or venting, scanning heat load measurements, frame deformation measurements. The majority of these are as described above. Those which have not been described above, or which may take a different form when the pellicle assembly has been removed from the mask, are described below:

EUV transmission measurements (pellicle assembly removed from mask)—an EUV radiation beam is directed onto the pellicle and the amount of EUV radiation which is transmitted by the pellicle is measured using a sensor located on an opposite side of the pellicle. This allows localized changes in transmission of the pellicle to be measured. For example, a test criterion for a pellicle may be transmission of 85% plus or minus 2%. If the transmission of the pellicle is higher than this (e.g. 87% or more) then this may indicate that a loss or material (e.g. capping layer material) from the pellicle has occurred. In this situation an increased risk of pellicle failure may arise, and the pellicle assembly may therefore be replaced with a new pellicle assembly. If the transmission of the pellicle is lower than the test criterion (e.g. 83% or less) then this may indicate that oxidation of the pellicle (e.g. oxidation of the capping layer) has occurred. An increased risk of pellicle failure may arise from the oxidation, and the pellicle assembly may therefore be replaced with a new pellicle assembly.

Birefringence measurements—birefringence measurements, which may also be referred to as photoelasticity measurements, may be used to measure localized changes in the stress of the pellicle film. Birefringence may for example is measured by directing a radiation beam through the pellicle and measuring changes of the polarization of the radiation beam. Measurements of the birefringence of the pellicle may be used to find changes in the stress of the pellicle and/or localized stress concentrations. When stress changes or localized stress concentrations are seen which indicate an increased risk of pellicle failure, the pellicle assembly may be replaced with a new pellicle assembly.

Fourier transform infra-red spectroscopy—infra-red radiation (e.g. over a range of wavelengths) is directed towards the pellicle and the absorption of that infra-red radiation is measured. This may be used to monitor for localized changes of infra-red absorption of the pellicle film. The technique can be used to monitor for localized changes of the emissivity of the pellicle. For example, a minimum emissivity value for the pellicle may be set as 0.3. If the emissivity (e.g. localized emissivity) is lower than 0.3 then this may indicate damage of the pellicle. The lower emissivity could cause a localized temperature increase of the pellicle during use in the lithographic apparatus which in turn gives rise to an increased risk of pellicle breakage. The pellicle assembly is therefore replaced with a new pellicle assembly.

'Measurement of pellicle displacement due to pressure difference—this involves applying a pressure on one side of the pellicle which is different to the pressure on the other side of the pellicle. The pellicle will deflect towards the lower pressure side. The degree of deflection is dependent upon the stress of the pellicle, and a deflection which falls outside of predetermined threshold values may indicate an increased risk of pellicle failure. In one example, a maximum threshold deflection of 500 µm for a pressure difference of 2 Pascals may be set. If the deflection is larger than 500 µm then this indicates a significant risk of pellicle breakage (e.g. during pumpdown or venting), and the pellicle assembly is therefore replaced with a new pellicle assembly. In another example, if the deflection is less than 400 µm then this may indicate that the stress in the pellicle is significantly higher than the stress in the pellicle as originally fabricated (i.e. as attached to the pellicle frame but before use in the lithographic apparatus). A significant increase of the stress in the pellicle may mean an increased risk of pellicle breakage during use by the lithographic apparatus. The pellicle assembly is therefore replaced with a new pellicle assembly.

Frame deformation measurements—this involves applying force to the pellicle frame to cause a deformation of the pellicle frame, and then monitoring wrinkles of the pellicle which occur during the pellicle frame deformation. The positions of wrinkles in the pellicle are indicative of the stress in the pellicle. An initial measurement of the positions of the wrinkles may be performed before the pellicle is used in order to provide a reference measurement. Following use, a change of position of the wrinkles compared with that seen in the reference measurement indicates a change in the stress of the pellicle. If a significant change of the stress of the pellicle is seen which is associated with an increased risk of pellicle breakage, then the pellicle assembly is replaced with a new pellicle assembly.

As mentioned further above, inspection of the pellicle after removal from the mask may be performed in parallel with inspection and/or cleaning of the mask.

Monitoring the pellicle, for example using one or more of the above techniques, allows damage of the pellicle to be identified early, and therefore allows the pellicle assembly to be replaced before failure of the pellicle occurs. If failure of the pellicle were to occur in the lithographic apparatus, e.g. during exposure of a substrate, then this could cause problematic contamination of the lithographic apparatus. This issue is avoided by monitoring for damage of the pellicle which is associated with an increased risk of pellicle failure, and replacing the pellicle as necessary when such damage is found.

Inspection of the pellicle for contamination may be performed at the same time as inspecting for pellicle damage.

Embodiments of the invention which relate to monitoring for damage of the pellicle may be combined with other embodiments of the invention described elsewhere in this document.

Various inventive aspects of a mask assembly have been described above and are shown in the figures in the context of specific embodiments of the invention. Various aspects of various methods have been described above. It will be appreciated that any of the described and/or illustrated aspects may be combined in a single embodiment. For example, one or more features of one embodiment may be combined with one or more features of another embodiment. It will further be appreciated that whilst some embodiments have been described that include more than one inventive aspect, embodiments that comprise only a single inventive aspect are also contemplated herein. In general any of the features of any of the described embodiments may be used in isolation or may be used in any combination with any of the other features of the described embodiments.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other mask). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims and clauses set out below.

1. A method comprising the steps of:
receiving a mask assembly comprising a mask and a removable EUV transparent pellicle held by a pellicle frame;
removing the pellicle frame and EUV transparent pellicle from the mask;
using an inspection tool to inspect the mask pattern on the mask; and
subsequently attaching to the mask an EUV transparent pellicle held by a pellicle frame.

2. The method of clause 1 further comprising:
after removing the pellicle frame and EUV transparent pellicle from the mask, attaching to the mask an alternative pellicle frame holding an alternative pellicle formed from a material which is substantially transparent to an inspection beam of the inspection tool; and
after using an inspection tool to inspect the mask pattern on the mask, removing the alternative pellicle held by the alternative pellicle frame from the mask in order to attach to the mask the EUV transparent pellicle held by the pellicle frame.

3. The method of clause 1 or 2, wherein removing the pellicle frame from the mask comprises disengaging an attachment mechanism from an attachment feature, and attaching the pellicle frame to the mask comprises engaging the attachment mechanism to an attachment feature.

4. The method of clause 3, wherein the attachment feature is coupled to the mask and wherein the attachment mechanism is coupled to the pellicle frame.

5. The method of clauses 3 or 4 wherein the attachment feature is coupled to the mask also after removing the pellicle frame and EUV transparent pellicle from the mask by disengaging the attachment mechanism from the attachment feature, such that the attachment feature is available for subsequent attachment of an EUV transparent pellicle held by a pellicle frame after inspecting the mask pattern on the mask.

6. The method of any one of clauses 3 to 5, wherein the attachment mechanism comprises a locking member configured to engage with an attachment feature comprising a protrusion.

7. The method of any preceding clause, wherein the EUV transparent pellicle and pellicle frame which is subsequently attached to the mask is the same EUV transparent pellicle and pellicle frame that was removed from the mask.

8. The method of any preceding clause, wherein the alternative pellicle is substantially transparent to a non-EUV radiation beam used by the mask inspection tool.

9. The method of clause 8, wherein the non-EUV radiation beam used by the mask inspection tool is a DUV radiation beam.

10. The method of any of clauses 2 to 7, wherein the alternative pellicle is substantially transparent to a particle beam used by the mask inspection tool.

11. The method of clause 10, wherein the particle beam used by the mask inspection tool is an electron beam.

12. The method of any one of clauses 2 to 11, wherein the alternative pellicle is attached to the mask using an attachment mechanism which is used solely for the alternative pellicle and is not used for the attachment of the EUV transparent pellicle.

13. The method of clause 12 wherein the alternative pellicle is attached to the mask such that the attachment feature of the EUV transparent pellicle does not touch the alternative pellicle.

14. The method of any preceding clause, wherein the mask is in a clean environment throughout the method.

15. The method of any preceding clause, wherein the method further comprises transferring the mask assembly inside a sealed container from a lithographic apparatus to a pellicle removal and attachment tool.

16. The method of any preceding clause, wherein the method further comprises transferring one or more selected from the mask, the pellicle assembly or the mask assembly inside a sealed container from a pellicle removal and attachment tool to a mask inspection tool.

17. The method according to any one of clauses 1 to 14, wherein the mask inspection tool is integrated with the pellicle removal and attachment tool such that the mask assembly stays in the same environment.

18. The method of any preceding clause, wherein the method further comprises cleaning the mask or the pellicle.

19. The method of clause 18 wherein the attachment feature remains coupled to the mask during cleaning.

20. The method of clause 18 wherein the attachment feature is removed from the mask before cleaning.

21. The method of clause 15 or clause 16, wherein the sealed container has a recessed portion configured to accommodate sagging of the pellicle.

22. The method of clause 21, wherein a separation between the recessed portion of the container and a plane of the pellicle of the mask assembly is between is between 0.5 mm and 2 mm.

23. The method of clause 22, wherein a separation between the recessed portion of the container and a plane of the pellicle of the mask assembly is between is between 0.5 mm and 1 mm.

24. A method comprising the steps of:
receiving a mask assembly comprising a mask and an EUV transparent pellicle held by a pellicle frame arranged to be removably attachable to the mask;
removing the pellicle frame and EUV transparent pellicle from the mask;
attaching to the mask an alternative pellicle held by an alternative pellicle frame arranged to be removably attachable to the mask, wherein the alternative pellicle is formed from a material different to the material used to form the EUV transparent pellicle, which material is substantially transparent to an inspection beam of an inspection tool;
using the inspection beam in the inspection tool to inspect the mask pattern on the mask;
removing the alternative pellicle from the mask; and
subsequently attaching to the mask an EUV transparent pellicle held by a pellicle frame.

25. A method according to clause 24 wherein the alternative pellicle frame is attached to the mask at a different location than the EUV transparent pellicle frame.

26. A mask assembly container comprising an opening through which a mask assembly may be placed inside the container, and a seal which seals shut the opening when the mask assembly is located inside the container, wherein the container has a floor configured to accommodate outward sagging of the pellicle.

27. The mask assembly container of clause 26, wherein the floor is between 0.5 mm and 1 mm or more away from a pellicle plane when the mask assembly is held in the sealed container.

28. A mask provided with a protrusion configured to receive a pellicle frame attachment mechanism, wherein a bottom surface of the protrusion has a lip which defines a recess in the surface of the base, and wherein the protrusion is attached to the mask by glue in the recess.

29. The mask of clause 28, wherein the volume of the glue is less than the volume of the recess.

30. The mask of clause 28 or clause 29, wherein the glue pulls the protrusion towards the mask such that the recess and the mask form a substantially enclosed space which retains the glue.

31. The mask according to clause 28 or 29 wherein the protrusion comprises an opening in the lip such that the recess and the mask form a space which is partially open for glue outgassing.

32. The mask according to any of clauses 28 to 31, wherein the protrusion is attached to substrate material of the mask.

33. A pellicle assembly container comprising an opening through which a pellicle assembly may be placed inside the container, and a seal which seals shut the opening when the pellicle assembly is located inside the container, wherein the container has a floor configured to accommodate outward sagging of the pellicle.

34. A mask provided with at least three protrusions configured to receive a pellicle frame attachment mechanism, wherein the protrusions are removably attached to the mask.

35. The mask of clause 33, wherein the protrusions are attached to substrate material of the mask.

36. A method of making a pellicle assembly, the method comprising:
forming a membrane on a substrate and etching away substrate material to expose the membrane and thereby provide a pellicle membrane supported by a substrate perimeter;
attaching a support frame to a portion of the substrate which borders the membrane;
providing a first cover on one side of the substrate and a second cover on an opposite side of the substrate and clamping them together to form a sealed environment which contains the pellicle membrane.

37. The method of clause 36, wherein the first cover is clamped against the substrate.
38. The method of clause 36 or clause 37, wherein the second cover is clamped against the substrate.
39. The method of any of clauses 36 to 38, wherein the method further comprises cutting away parts of the substrate which project beyond the first and second covers.
40. The method of any of clauses 36 to 39, wherein the substrate is a silicon wafer.
41. The method of any of clauses 36 to 40, wherein the second cover covers the support frame such that the support frame is located within the sealed environment.
42. The method of any of clauses 36 to 41, wherein the first cover includes a recess configured to accommodate sagging of the pellicle membrane.
43. The method of any of clauses 36 to 42, wherein the method is performed at a pellicle manufacturing location.
44. A method comprising the method of any of clauses 36 to 43, and further comprising forming a mask assembly by:
    attaching a pellicle location tool to the support frame;
    removing the second cover from the pellicle assembly;
    attaching the support frame to a mask; and
    removing the first cover from the pellicle assembly using the pellicle location tool.
45. The method of clause 44, wherein the pellicle location tool includes arms which are received in blind holes provided in the support frame.
46. The method of clause 44 or clause 45, wherein that method is performed at a mask shop.
47. The method of any of clauses 44 to 46, wherein the method further comprises putting the mask assembly inside a container and sealing that container.
48. A pellicle assembly comprising a pellicle membrane extending from a substrate border portion, a support frame attached to the substrate border portion, a first cover and a second cover, wherein the first and second covers are provided on opposite sides of the substrate border portion and form a sealed environment which contains the pellicle membrane.
49. The pellicle assembly of clause 48, wherein the second cover covers the support frame such that the support frame is located within the sealed environment.
50. The pellicle assembly of clause 48 or clause 49, wherein the first and second covers are clamped against the substrate border portion.
51. A mask provided with a protrusion configured to receive a pellicle frame attachment mechanism, wherein a base surface of the protrusion has a groove such that a glue is drawn by capillary action in a volume enclosed by the groove and the mask, such that the protrusion is attached by the glue to the mask and the groove is partially open for glue outgassing.
52. A method of monitoring a pellicle of a mask assembly, the mask assembly comprising a pellicle assembly and a mask, the method comprising:
    measuring a property of the pellicle and monitoring for a change of the property which is associated with an increased risk of pellicle breakage, and
    when such a change is seen removing the pellicle assembly from the mask and replacing it with a new pellicle assembly.
53. The method of clause 52, wherein the property of the pellicle is measured when the mask assembly is in situ in the lithographic apparatus.
54. The method of clause 53, wherein the property is infra-red emission of the pellicle and/or is deflection of the pellicle during scanning movement of the mask assembly.
55. The method of any of clauses 52 to 54, wherein the method comprises transferring the mask assembly to a mask assembly inspection tool and then measuring the property of the pellicle using the mask assembly inspection tool.
56. The method of clause 55, wherein one or more of the following measurement techniques are used to measure one or more properties of the pellicle: EUV reflection measurements, EUV transmission measurements, ellipsometry, Raman spectroscopy, X-ray reflection measurements, microscope inspection, resonance measurements, scanning heat load measurements, pellicle deflection during pumpdown or venting.
57. The method of any of clauses 52 to 56, wherein the method comprises removing the pellicle assembly from the mask, transferring the pellicle assembly to a pellicle assembly inspection tool and then measuring the property of the pellicle using the pellicle assembly inspection tool.
58. The method of clause 57, wherein one or more of the following measurement techniques are used to measure one or more properties of the pellicle: EUV transmission measurements (pellicle assembly removed from mask), EUV reflection measurements, birefringence measurements, ellipsometry, Fourier transform infra-red spectroscopy, Raman spectroscopy, X-ray reflection measurements, microscope inspection, resonance measurements, measurement of pellicle displacement due to pressure difference, deflection during pumpdown or venting, scanning heat load measurements, frame deformation measurements.

The invention claimed is:

1. A method comprising:
    receiving a mask assembly comprising a mask and a removable EUV transparent pellicle held by a pellicle frame;
    removing the pellicle frame and EUV transparent pellicle from the mask;
    using a mask inspection tool to inspect the mask pattern on the mask; and
    subsequently attaching to the mask the pellicle frame and EUV transparent pellicle or another EUV transparent pellicle held by the pellicle frame or another pellicle frame.

2. The method of claim 1, further comprising:
    after removing the pellicle frame and EUV transparent pellicle from the mask, attaching to the mask an alternative pellicle frame holding an alternative pellicle formed from a material that is substantially transparent to an inspection beam of the inspection tool; and
    after using an inspection tool to inspect the mask pattern on the mask, removing the alternative pellicle held by the alternative pellicle frame from the mask in order to attach to the mask the EUV transparent pellicle held by the pellicle frame.

3. The method of claim 1, wherein removing the pellicle frame from the mask comprises disengaging an attachment mechanism from an attachment feature, and attaching the pellicle frame to the mask comprises engaging the attachment mechanism to an attachment feature.

4. The method of claim 1, wherein attaching to the mask the alternative pellicle frame holding the alternative pellicle comprises attaching an alternative pellicle that is substantially transparent to a non-EUV radiation beam used by the mask inspection tool.

5. The method of claim 2, wherein attaching to the mask the alternative pellicle frame holding the alternative pellicle comprises attaching an alternative pellicle that is substantially transparent to a particle beam used by the mask inspection tool.

6. The method of claim 1, wherein the method further comprises transferring the mask assembly inside a sealed container from a lithographic apparatus to a pellicle removal and attachment tool.

7. The method of claim 1, wherein the attachment feature is coupled to the mask and wherein the attachment mechanism is coupled to the pellicle frame.

8. The method of claim 1, wherein the attachment feature is coupled to the mask after removing the pellicle frame and EUV transparent pellicle from the mask by disengaging the attachment mechanism from the attachment feature, such that the attachment feature is available for subsequent attachment of an EUV transparent pellicle held by a pellicle frame after inspecting the mask pattern on the mask.

9. The method of claim 1, wherein the attachment mechanism comprises a locking member configured to engage with an attachment feature comprising a protrusion.

10. The method of claim 1, wherein the EUV transparent pellicle and pellicle frame which is subsequently attached to the mask is the same EUV transparent pellicle and pellicle frame that was removed from the mask.

11. The method of claim 2, wherein the alternative pellicle is substantially transparent to a non-EUV radiation beam used by the mask inspection tool.

12. The method of claim 4, wherein the non-EUV radiation beam used by the mask inspection tool is a DUV radiation beam.

13. The method of any of claim 2, wherein the alternative pellicle is substantially transparent to a particle beam used by the mask inspection tool.

14. The method of claim 5, wherein the particle beam used by the mask inspection tool is an electron beam.

15. The method of claim 2, wherein the alternative pellicle is attached to the mask using an attachment mechanism which is used solely for the alternative pellicle and is not used for the attachment of the EUV transparent pellicle.

16. The method of claim 2, wherein the alternative pellicle is attached to the mask such that the attachment feature of the EUV transparent pellicle does not touch the alternative pellicle.

17. The method of claim 1, wherein the mask is in a clean environment throughout the method.

18. The method of claim 1, wherein the method further comprises transferring one or more of the mask, the pellicle assembly or the mask assembly inside a sealed container from a pellicle removal and attachment tool to a mask inspection tool.

19. The method of claim 1, wherein the mask inspection tool is integrated with the pellicle removal and attachment tool such that the mask assembly stays in the same environment.

20. The method of claim 1, wherein the method further comprises cleaning the mask or the pellicle.

21. The method of claim 3, wherein the attachment feature remains coupled to the mask during cleaning.

22. The method of claim 3, wherein the attachment feature is removed from the mask before cleaning.

23. The method of claim 6, wherein the sealed container has a recessed portion configured to accommodate sagging of the pellicle.

24. The method of claim 23, wherein a separation between the recessed portion of the sealed container and a plane of the pellicle of the mask assembly is between 0.5 mm and 2 mm.

25. The method of claim 23, wherein a separation between the recessed portion of the sealed container and a plane of the pellicle of the mask assembly is between 0.5 mm and 1 mm.

26. A method comprising:
receiving a mask assembly comprising a mask and an EUV transparent pellicle held by a pellicle frame arranged to be removably attachable to the mask;
removing the pellicle frame and EUV transparent pellicle from the mask;
attaching to the mask an alternative pellicle held by an alternative pellicle frame arranged to be removably attachable to the mask, wherein the alternative pellicle is formed from a material different to the material used to form the EUV transparent pellicle, which material is substantially transparent to an inspection beam of an inspection tool;
using the inspection beam in the inspection tool to inspect the mask pattern on the mask;
removing the alternative pellicle from the mask; and
subsequently attaching to the mask the pellicle frame and EUV transparent pellicle or another EUV transparent pellicle held by the pellicle frame or another pellicle frame.

27. The method of claim 26, wherein the alternative pellicle frame is attached to the mask at a different location than the EUV transparent pellicle frame.

\* \* \* \* \*

UNITED STATES PATENT AND TRADEMARK OFFICE
CERTIFICATE OF CORRECTION

PATENT NO.        : 10,571,800 B2                                    Page 1 of 1
APPLICATION NO.   : 15/545390
DATED             : February 25, 2020
INVENTOR(S)       : Brouns et al.

It is certified that error appears in the above-identified patent and that said Letters Patent is hereby corrected as shown below:

On the Title Page

Item (72), replace "Herentals (NL)" with --Herentals (BE)--.

Item (72), replace "Kasterlee (NL)" with --Kasterlee (BE)--.

Item (72), replace "Menlo Park (NL)" with --Menlo Park, CA (US)--.

In the Claims

In Column 33, Line 27, replace "The method of any of claim 2" with --The method of claim 2--.

In Column 34, Line 33, replace "which material" with --wherein the different material--.

Signed and Sealed this
Twenty-fifth Day of August, 2020

Andrei Iancu
*Director of the United States Patent and Trademark Office*